(12) United States Patent
Golparvar-Fard et al.

(10) Patent No.: US 11,288,412 B2
(45) Date of Patent: Mar. 29, 2022

(54) COMPUTATION OF POINT CLOUDS AND JOINT DISPLAY OF POINT CLOUDS AND BUILDING INFORMATION MODELS WITH PROJECT SCHEDULES FOR MONITORING CONSTRUCTION PROGRESS, PRODUCTIVITY, AND RISK FOR DELAYS

(71) Applicant: The Board of Trustees of the University of Illinois, Urbana, IL (US)

(72) Inventors: Mani Golparvar-Fard, Champaign, IL (US); Derek Hoiem, Champaign, IL (US); Jacob Je-Chian Lin, Urbana, IL (US); Kook In Han, Cary, NC (US); Joseph M. Degol, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 581 days.

(21) Appl. No.: 15/956,266

(22) Filed: Apr. 18, 2018

(65) Prior Publication Data
US 2019/0325089 A1 Oct. 24, 2019

(51) Int. Cl.
*G06F 30/13* (2020.01)
*G06Q 10/06* (2012.01)
(Continued)

(52) U.S. Cl.
CPC .......... *G06F 30/13* (2020.01); *G06F 3/04815* (2013.01); *G06Q 10/0633* (2013.01);
(Continued)

(58) Field of Classification Search
CPC ................ G06F 30/13; G06F 3/04815; G06Q 10/06313; G06Q 10/06316;
(Continued)

(56) References Cited

U.S. PATENT DOCUMENTS 8,249,909 B2 8/2012 Watanabe et al.
9,070,216 B2 6/2015 Golparvar-Fard et al.
(Continued)

OTHER PUBLICATIONS

Golparvar Fard, M. "D4AR—4 Dimensional Augmented Reality-Models for Automation and Interactive Visualization of Construction Progress Monitoring" [thesis] University of Illinois at Urbana-Champaign [retrieved on Aug. 26, 2020]. (Year: 2010).*
(Continued)

*Primary Examiner* — Rehana Perveen
*Assistant Examiner* — Alfred H B Wechselberger
(74) *Attorney, Agent, or Firm* — Lowenstein Sandler LLP

(57) ABSTRACT

A system initializes a set of calibrated images with known 3D pose relative to a 3D building information model (BIM) to be anchor images, detects features within images of unknown position and orientation, and determines matches with features of the calibrated images. The system determines a subset of the images that have at least a threshold number of matching features, selects an image from the subset of the images having the largest number of matching features, and executes a reconstruction algorithm using the image and the anchor images to calibrate the image to the BIM and generate an initial 3D point cloud model. The system repeats the last steps to identify a second image from the subset and perform, starting with the initial 3D point cloud model and using the second image, 3D reconstruction to generate an updated 3D point cloud model that is displayable in a graphical user interface.

17 Claims, 33 Drawing Sheets

(51) Int. Cl.
| | |
|---|---|
| *G06T 15/20* | (2011.01) |
| *G06T 17/05* | (2011.01) |
| *G06T 19/00* | (2011.01) |
| *G06F 3/0481* | (2013.01) |
| *G06Q 50/08* | (2012.01) |
| *G06F 3/04815* | (2022.01) |

(52) U.S. Cl.
CPC ... *G06Q 10/0635* (2013.01); *G06Q 10/06313* (2013.01); *G06Q 10/06316* (2013.01); *G06Q 10/06393* (2013.01); *G06T 15/20* (2013.01); *G06T 17/05* (2013.01); *G06T 19/003* (2013.01); *G06Q 50/08* (2013.01)

(58) Field of Classification Search
CPC ........... G06Q 10/0633; G06Q 10/0635; G06Q 10/06393; G06Q 50/08; G06T 15/20; G06T 17/05; G06T 19/003; G06T 7/579; G06T 7/593; G06T 2207/30184; G06T 2207/10028; G06T 7/00
See application file for complete search history.

(56) References Cited

U.S. PATENT DOCUMENTS

| | | | |
|---|---|---|---|
| 9,355,495 | B2 | 5/2016 | Miller |
| 9,852,238 | B2 | 12/2017 | Forsyth et al. |
| 2011/0054652 | A1 | 3/2011 | Heil |
| 2013/0147798 | A1 | 6/2013 | Karsch et al. |
| 2013/0155058 | A1* | 6/2013 | Golparvar-Fard ...... G06T 17/00 345/419 |
| 2015/0310135 | A1* | 10/2015 | Forsyth ................... G06F 30/13 703/1 |
| 2017/0193693 | A1* | 7/2017 | Robert ....................... G06T 7/55 |
| 2018/0315232 | A1* | 11/2018 | Jones ..................... G06T 15/005 |

OTHER PUBLICATIONS

Bae, H. "Fast and Scalable Structure-from-Motion for High-precision Mobile Augmented Reality Systems" [thesis] Virginia Polytechnic Institute and State University [retrieved on Aug. 29, 2020]. (Year: 2014).*
Golparvar-Fard, et al. "Monitoring Changes of 3D Building Elements from Unordered Photo Collections" 2011 IEEE Int. Conf. on Computer Vision Workshops [retrieved on Aug. 21, 2020]. (Year: 2011).*
Halmedari et al. "IFC-Based Development of As-Built and As-Is BIMs Using Construction and Facility Inspection Data: Site-to-BIM Data Transfer Automation" Journal of Computing in Civil Engineering, vol. 32, Iss. 2 (Mar. 2018) [retrieved on Aug. 26, 2020] (Year: 2018).*
Sacks et al. "Requirements for Building Information Modeling based Lean Production Management Systems for Construction" Automation in Construction. (Year: 2010).*
Atasoy, G. "Visualizing and Interacting with Construction Project Performance Information" [thesis] Carnegie Mellon University, Chap 3 and 4 [retrieved on Aug. 27, 2020]. (Year: 2013).*
Garcia-Lopez, et al. "A System to Track Work Progress at Construction Jobsites" Proceedings of the 2014 Industrial and Systems Engineering Research Conf. (Year: 2015).*
Lin et al. "Web-Based 4D Visual Production Models for Decentralized Work Tracking and Information Communication on Construction Sites" Construction Research Congress 2016 [retrieved on Aug. 27, 2020]. (Year: 2016).*
Song et al. "Project Dashboard: Concurrent Visual Representation Method of Project Metrics on 3D Building Models" Computing in Civil Engineering [retrieved on Aug. 28, 2020] (Year: 2005).*
Han et al. "Potential of big visual data and building information modeling for construction performance analytics: An exploratory study" Automation in Construction, vol. 73 [retrieved on Aug. 25, 2020] (Year: 2017).*

Golparvar-Fard et al. "D4AR—A 4-Dimensional Augmented Reality Model for Automatic Construction Progress Monitoring Data Collection, Processing and Communication" Journal of Information Technology in Construction. (Year: 2009).*
Fathi et al. "Automated as-built 3D reconstruction of civil infrastructure using computer vision: Achievements, opportunities, and challenges"Advanced Engineering Informatics, vol. 29, pp. 149-161 <https://www.sciencedirect.com/science/article/pii/S1474034615000245> (Year: 2015).*
Kropp et al. "Interior construction state recognition with 4D BIM registered image sequences" Automation in Construction, vol. 86 (Published Nov. 2017), pp. 11-32 [retrieved on Jun. 4, 2021] (Year: 2018).*
Li et al. "Location Recognition Using Prioritized Feature Matching" K. Daniilidis, P. Maragos, N. Paragios (Eds.): ECCV 2010, Part II, LNCS 6312, pp. 791-804 [retrieved on Aug. 25, 2020] (Year: 2010).*
Muthukumar, B. "Appearance-Based Material Classification After Occlusion Removal for Operation-Level Construction Progress Monitoring" [Master's Thesis] Graduate College of Civil Engineering, University of Illinois at Urbana-Champaign [retrieved on Aug. 25, 2020] (Year: 2015).*
Verykokou et al. "3D reconstruction of disaster scenes for urban search and rescue" Multimed Tools Appl (2018) 77:9691-9717; https://doi.org/10.1007/s11042-017-5450-y [retrieved on Nov. 23, 2021] (Year: 2017).*
Verhoeven et al. "Mapping by matching: a computer vision-based approach to fast and accurate georeferencing of archaeological aerial photographs" Journal of Archaeological Science 39 (2012) 2060-2070 [retrieved on Nov. 23, 2021] (Year: 2012).*
Muzzupappa et al. "3D reconstruction of an outdoor archaeological site through a multi-view stereo technique" 2013 Digital Heritage International Congress (DigitalHeritage), 2013, pp. 169-176, doi: 10.1109/DigitalHeritage.2013.6743727 [retrieved on Nov. 23, 2021] (Year: 2013).*
Koo, B. et al., "Formalization of Construction Sequencing Rationale and Classification Mechanism to Support Rapid Generation of Sequencing Alternatives," Journal of Computing in Civil Engineering, 21 (6):423-433, Nov./Dec. 2007.
Koskela, L., et al., "The Underlying Theory of Project Management is Obsolete," Engineering Management Review, IEEE, article 36(2), 22-34, 16 pages, 2008.
Lee, Sanghoon, and Akin, Omer,"Augmented Reality-Based Computational Fieldwork Support for Equipment Operations and Maintenance," Automation in Construction, vol. 4, No. 20, pp. 338-352 (2011).
Leigard, A., et al., "Defining the Path—A Case Study of Large Scale Implementation of Last Planner," Proceedings IGLC-18, pp. 396-405, Jul. 2010.
Lin, J., et al., "Model-Based Monitoring of Work-In-Progress via Images Taken by Camera-Equipped UAV and BIM," 2nd ICCCBEI, Tokyo, Japan, Mossman, A., 8 pages, (2013), (2015).
Lindhard, S., et al., "Improving Onsite Scheduling: Looking Into the Limits of Last Planner System," The Built & Human Environment Review, vol. 6, pp. 46-60, 2013.
Lowe, David G. "The Viewpoint Consistency Constraint," International Journal of Computer Vision, vol. 1, No. 1, pp. 57-72 (1987).
Mossman, A. "Last Planner®: 5+1 Crucial & Collaborative Conversations for Predictable Design & Construction Delivery," Lean Construction Journal, 2013, 37 pages, Dec. 2015.
Paris, Sylvain and Durand, Fredo, "A Fast Approximation of the Bilateral Filter Using a Signal Processing Approach," In Computer Vision—ECCV 2006, pp. 568-580 (2006).
Photosynth, Wikipedia, the free encyclopedia, download available via web page at https://en.wikipedia.org/wiki/Photosynth, 3 pages, downloaded (Jul. 17, 2015), last modified on Apr. 13, 2015.
Russell, Bryan C., et. al., "Automatic Alignment of Paintings and Photographs Depicting a 3D Scene," 3rd International IEEE Workshop on 3D Representation for Recognition (3dRR-11), associated with IEEE International Conference on Computer Vision Workshops (ICCV) 2011, pp. 545-552 (2011).

(56) References Cited

OTHER PUBLICATIONS

Sacks, R., "Requirements for Building Information Modeling Based Lean Production Management Systems for Construction," Automation in Construction, 19(5), pp. 641-655, 2010.
Sacks, R., et al., "Interaction of Lean and Building Information Modeling in Construction," Journal of construction Engineering and Management, article, American Society of Civil Engineers, 136(9), 968-980, Sep. 2010.
Sacks, R., et al., "KanBIM Workflow Management System: Prototype Implemenation and Field Testing," Lean Construction Journal, LCI, 9(1), pp. 19-35, 2013.
Scheiblauer, Claus, et al., "Graph-Based Guidance in Huge Point Clouds," In Proceedings of the 17th International Conference on Cultural Heritage and New Technologies, 8 pages, 2012.
Seitz, Steven M., et.al., "A Comparison and Evaluation of Multi-View Stereo Reconstruction Algorithms," In IEEE Computer Society Conference on Computer Vision and Pattern Recognition (CVPR'2006), vol. 1, pp. 519-526, (Jun. 2006).
Shin, Do Hyoung and Dunston, Phillip S., "Technology Development Needs for Advancing Augmented Reality-Based Inspection," Automation in Construction, vol. 19, No. 2, pp. 169-182 (2010).
Snavely, Noah, et al., "Finding Paths through the World's Photos," In ACM Transactions on Graphics (TOG), vol. 27, No. 3, 11 pages (2008).
Snavely, Noah, et. al., "Photo Tourism: Exploring Photo Collections in 3D," In ACM transactions on graphics (TOG), vol. 25, No. 3, pp. 835-846 (2006).
Snavely, Noah, et. al.,"Modeling the World from Internet Photo Collections," International Journal of Computer Vision 80, No. 2. pp. 189-210 (Oct. 31, 2007).
Son, H., "As-Built Data Acquisition and its Use in Production Monitoring and Automated Layout of Civil Infrastructure: A Survey," Advanced Engineering Informatics, 29(2), pp. 172-183, 2015.
Turkan, Y., et al., "Toward Automated Earned Value Tracking Using 3D Imaging Tools," Journal of Construction Engineering and Management, pp. 423-433, Apr. 2013.
Turkan, Yelda et. al., "Automated Progress Tracking using 4D Schedule and 3D Sensing Technologies," Automation in Construction 22, pp. 414-421 (2012).
Werner, Tomas and Zisserman, Andrew, "New Techniques for Automated Architectural Reconstruction from Photographs," In Computer Vision—ECCV 2002, pp. 541-555 (2002).
Woodward, Charles, et. al., "Mixed Reality for Mobile Construction Site Visualization and Communication," In Proc. 10th International Conference on Construction Applications of Virtual Reality (CONVR), pp. 4-5, (2010).
Wu, Changchang, "Towards Linear-Time Incremental Structure from Motion," In International Conference on 3D Vision—3DV, pp. 127-134 (2013).
Wu, Changchang, et. al., "Multicore Bundle Adjustment," In IEEE Conference on Computer Vision and Pattern Recognition (CVPR), pp. 3057-3064 (2011).
Yabuki, Nobuyoshi, et. al., "Collaborative and Visualized Safety Planning for Construction Performed at High Elevation," In Cooperative Design, Visualization, and Engineering, pp. 282-285 (2010).
Yang, J., et al., "Construction Performance Monitoring via Still Images, Time-Lapse Photos, and Video Streams: Now, Tomorrow, and the Future," Advanced Engineering Informatics, article, Elsevier, pp. 211-224, 2015.
Yu, H., et al., "Development of Lean Model for House Construction Using Value Stream Mapping," Journal of Construction Engineering and Management, 135(8), pp. 782-790, Aug. 2009.
Zollmann, Stefanie, "Interactive 4D Overview and Detail Visualization in Augmented Reality," In IEEE International Symposium on Mixed and Augmented Reality (ISMAR), pp. 167-176 (2012).
Zollmann, Stefanie, et. al., "Image-Based Ghostings for Single Layer Occlusions in Augmented Reality," In 9th IEEE International Symposium on Mixed and Augmented Reality (ISMAR), pp. 19-26 (2010).

"Advancing the Competitiveness and Efficiency of the US Construction Industry," The National Academy of Sciences Engineering Medicine, The National Academies Press, http://nap.edu/12717, Washington, DC, 123 pages, 2009.
Abeid, J., et al., "Photo-Net II: A Computer-Based Monitoring System Applied to Project Management", Automation in Construction, 12(2003), 603-616,Accepted May 13, 2003.
Agarwal, Sameer, et. al., "Building Rome in a Day," Communications of the ACM 54, No. 10, pp. 105-112 (Oct. 2011).
Alarcon, L. F., et al., "Assessing the Impacts of Implementing Lean Construction", Revista ingenieria de Construccion, Chile, vol. 23, No. 1, pp. 26-33, Apr. 2008.
Aritua, B., et al., "Construction Client Multi-Projects—A Complex Adaptive System Perspective", International Journal of Project Management, Elsevier, 27, pp. 72-79, 2009.
Aubry, Mathieu, Bryan C. Russell, and Josef Sivic, "Painting-to-3D Model Alignment via Discriminative Visual Elements," ACM Transactions on Graphics (TOG) 33, No. 2, pp. 1-14 (2014).
Bae, H, et al., "High-Precision Vision-Based Mobile Augmented Reality System for Context-Aware Architectural, Engineering, Construction and Facility Management (AEC/FM) Applications", Visualization in Engineering, Springer, 1 (1), pp. 1-13, 2013.
Bae, H., et al., "Image-Based Localization and Content Authoring in Structure-from-Motion Point Models for Real-Time Field Reporting Applications", J. Comput. Civ. Eng., DOI:1023 .1061/(ASCE)CP. 1943-5487.0000392, 637-644, 2014.
Bae, Soonmin, Aseem Agarwala, and Frédo Durand, "Computational Rephotography," ACM Trans Graph 29, No. 3, pp. 1-15 (Jun. 2010).
Ballard, G. "The Last Planner System of Production Control," PhD at the University of Birmingham, 193 pages, May 2000.
Ballard, G., et al., "Implementing Lean Construction: Stabilizing Work Flow," Lean Construction, 10 pages, 1994.
Bartoli, Adrien, "Towards Gauge Invariant Bundle Adjustment: A Solution Based on Gauge Dependent Damping," In Computer Vision Proceedings., Ninth IEEE International Conference on Computer Vision, pp. 760-765 (Oct. 2003).
Beetz, Jakob, et al., BIMServer.Org, "Org-An Open Source IFC Model Server," In Proceedings of the CIP W78 2010: 27th International Conference—Cairo, Egypt, 8 pages, Nov. 16-18, 2017.
Behzadan, Amir H., and Kamat, Vineet R., "Visualization of Construction Graphics in Outdoor Augmented Reality," In Proceedings of the 37th conference on Winter Simulation, pp. 1914-1920 (2005).
Besl, P.J., et al., "A Method for Registration of 3-D Shapes", IEEE Transactions on Pattern Analysis and Machine Intelligence, vol. 14, No. 2, pp. 239-256, Feb. 1992.
Bortolazza, R.C., et al., "A Quantitative Analysis of the Implementation of the Last Planner System in Brazil", 13th Conference of the International Group on Lean Construction, 413-420, 2005.
Bosche, F., et al., "Tracking the Built Status of MEP Works: Assessing the Value of a Scan-vs-BIM System", Journal of Computing in Civil Engineering Article, 28(4); 05014004, 13 pages, 2014.
Brodetskaia, I., "Stabilizing Production Flow of Interior and Finishing Works with Reentrant Flow in Building Construction," Journal of Construction Engineering and Management, article, 139(6), 665-674, Jun. 2013.
Côté, Stephane, et.al., "Live Mobile Panoramic High Accuracy Augmented Reality for Engineering and Construction," Proceedings of the Construction Applications of Virtual Reality (CONVR), London, England, pp. 1-10 (Oct. 2013).
Crandall, David, et.al., "Discrete-Continuous Optimization for Large-Scale Structure from Motion," In Computer Vision and Pattern Recognition (CVPR), IEEE Conference, pp. 3001-3008 (2011).
Dave, B., et al., "Addressing Information Flow in Lean Production Management and Control in Construction," Proceeding of the 22nd International Group for Lean Construction (IGLC22), article, 2, 581-592, Jun. 2014.
Dave, B., et al., "Exploring the Recurrent Problems in the Last Planner Implementation on Construction Projects," Lean Construction Conference (ILCC 2015), 1-10.

(56) References Cited

OTHER PUBLICATIONS

Dellepiane, Matteo, et.al., "Assisted Multi-View Stereo Reconstruction," In 3D Vision—3DV International Conference, pp. 318-325 (2013).
Dunston, Phillip S., et. al., "Mixed Reality Benefits for Design Perception," NIST Special Publication SP, pp. 191-196 (2003).
Echeverry, D. et al., "Sequencing Knowledge for Construction Scheduling", Journal of Construction Engineering and Management, 117(1):118-130, 1991.
Fitzgibbon, Andrew W., "Robust Registration of 2D and 3D Point Sets", 10 pages, 2001.
Franken, Thomas, et al., "Minimizing User Intervention in Registering 2D Images to 3D Models," The Visual Computer 21, No. 8-10, pp. 619-628 (2005).
Furukawa, Yasutaka, and Ponce, Jean, "Accurate, Dense, and Robust Multiview Stereopsis," IEEE Transactions on Pattern Analysis and Machine Intelligence, vol. 32, No. 8, pp. 1362-1376 (2010).
Garcia-Lopez, N.P., et al., "A System to Track Work Progress at Construction Jobsites," Industrial and Systems Engineering Research Conference, 10 pages, 2014.
Golparvar-Fard, M., et al., "D4AR—A 4-Dimensional Augmented Reality Model for Automating Construction Progress Data Collection, Processing and Communication", Journal of ITCON—vol. 14, published at http://www.itcon.org/2009/13, pp. 129-153, Jun. 2009.
Golparvar-Fard, Mani, et al. "Automated Progress Monitoring Using Unordered Daily Construction Photographs and IFC-Based Building Information Models," Journal of Computing in Civil Engineering, pp. 04014025-1-04014025-19, 2015.
Golparvar-Fard, Mani, et al., "Visualization of Construction Progress Monitoring with 4D Simulation Model Overlaid on Time-Lapsed Photographs," Journal of Computing in Civil Engineering, vol. 23, No. 6, pp. 391-404 (2009).
Golparvar-Fard, Mani, et al., "Integrated Sequential As-Built and As-Planned Representation with D4AR Tools in Support of Decision-Making Tasks in the AEC/FM industry," Journal of Construction Engineering and Management, pp. 1099-1116(Dec. 2011).
Golparvar-Fard, Mani, et. al., "Visual Representation of Construction Progress Monitoring Metrics on Time-Lapse Photographs," In Proc. Construction Management and Economics Conference, pp. 1-10 (Retrieved on Aug. 18, 2015).
Gurevich, U., et al., "Examination of the Effects of KanBIM Production Control System on Subcontractors' Task Selection in Interior Works," Automation in Construction, 37, pp. 81-87, 2014.
Hakkarainen, M. et al., "Software Architecture for Mobile Mixed Reality and 4D BIM Interaction," In Proc. 25th CIB W78 Conference, pp. 1-8 (2009).

Ham, Y., et al., "Visual Monitoring of Civil Infrastructure Systems via Camera-Equipped Unmanned Aerial Vehicles: A Review of Related Works," Visualization in Engineering, 4(1), pp. 1-8, 2016.
Hammad, Amin, Wang, Hui, and Mudur, Sudhir P., "Distributed Augmented Reality for Visualizing Collaborative Construction Tasks," Journal of Computing in Civil Engineering, 10 pages (Nov./Dec. 2009).
Hamzeh, F., et al., "Rethinking Lookahead Planning to Optimize Construction Workflow," Lean Construction Journal, article, pp. 15-34, 2012.
Hamzeh, F.R. et al., "Understanding the Role of 'Tasks Anticipated' in Lookahead Planning Through Simulation," Automation in Construction., 49, 18-26, 2015.
Han, K., et al., "Appearance-Based Material Classification for Monitoring of Operation-Level Construction Progess Using 4D BIM and Site Photologs," Automation in Construction, 53, 44-57, 2015.
Han, K., K., et al., "Formalized Knowledge of Construction Sequencing for Visual Monitoring of Work-In-Progree via Incomplete Point Clouds and Low-LoD 4D BIMs," Advanced Engineering Informatics, 29(4), 889-901, 2015.
Hartley, Richard, Gupta, Rajiv, and Chang, Tom, "Stereo from Uncalibrated Cameras," In Computer Vision and Pattern Recognition, Proceedings CVPR '92., IEEE Computer Society Conference on Computer Vision, pp. 761-764 (1992).
Hewage, K. N., et al., "A Novel Solution for Construction On-Site Communication—The Information Booth," Canadian Journal of Civil Engineering,vol. 36, pp. 659-671, 2009.
Horn, Berthold, K. P., "Closed-Form Solution of Absolute Orientaton Using Unit Quaternions," Journal of the Optical Society of America A, vol. 4, No. 4, pp. 629-642, Apr. 1987.
Huttenlocher, Daniel P. and Ullman, Shimon, "Object Recognition using Alignment," In Proc. ICCV, vol. 87, pp. 102-111. (1987).
Kahkonen, Kalle, et. al., "Integrating Building Product Models with Live Video Stream," pp. 176-188 (Oct. 22-23, 2007).
Kamat, Vineet R., et al., "Integration of Global Positioning System and Inertial Navigation for Ubiquitous Context-Aware Engineering Applications," Proc., National Science Foundation Grantee Conference, Atlanta, GA, inproceedings, 1-10, 6 pages, 2010.
Karsch, Kevin, et al., "ConstructAide: Analyzing and Visualizing Construction Sites Through Photographs and Building Models," ACM Transactions on Graphics (TOG), 33(6): 176, 11 pages, 2014.
Karsch, Kevin, et. al., "Rendering Synthetic Objects into Legacy Photographs," In ACM Transactions on Graphics (TOG), vol. 30, No. 6, 12 pages (2011).

* cited by examiner

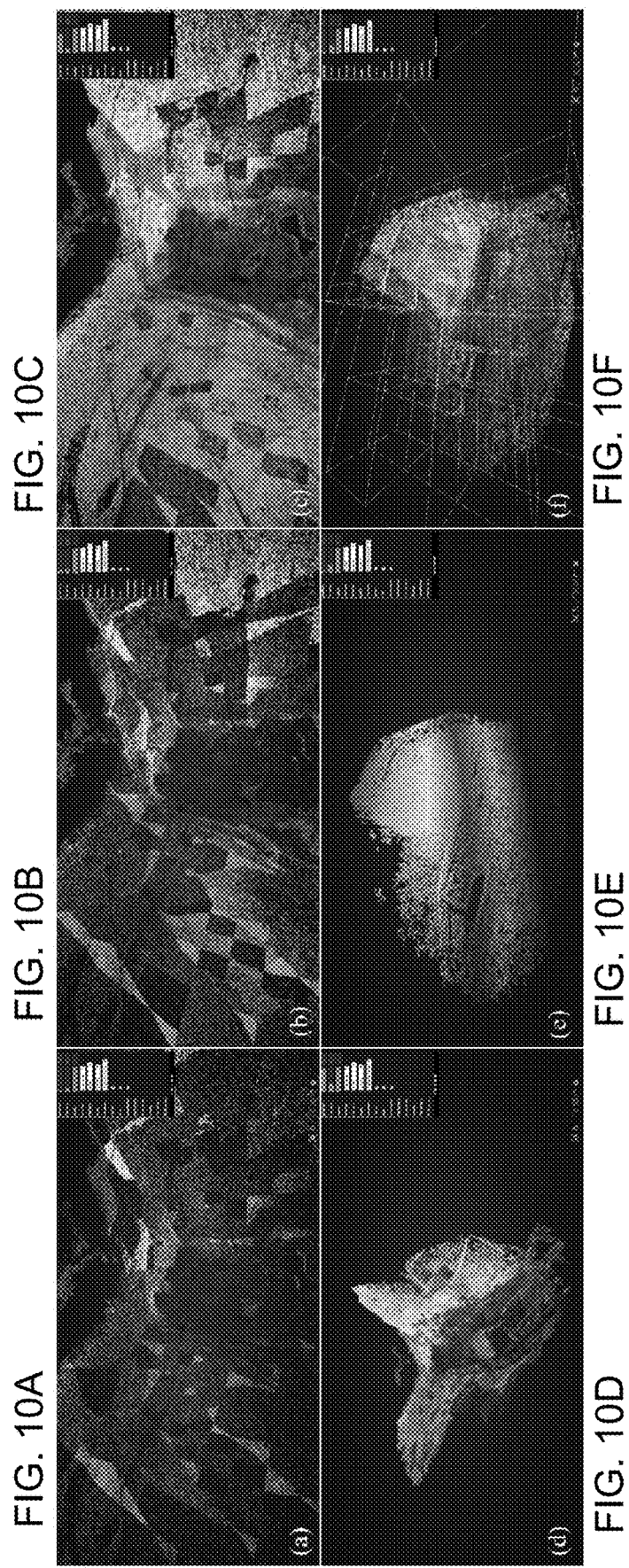

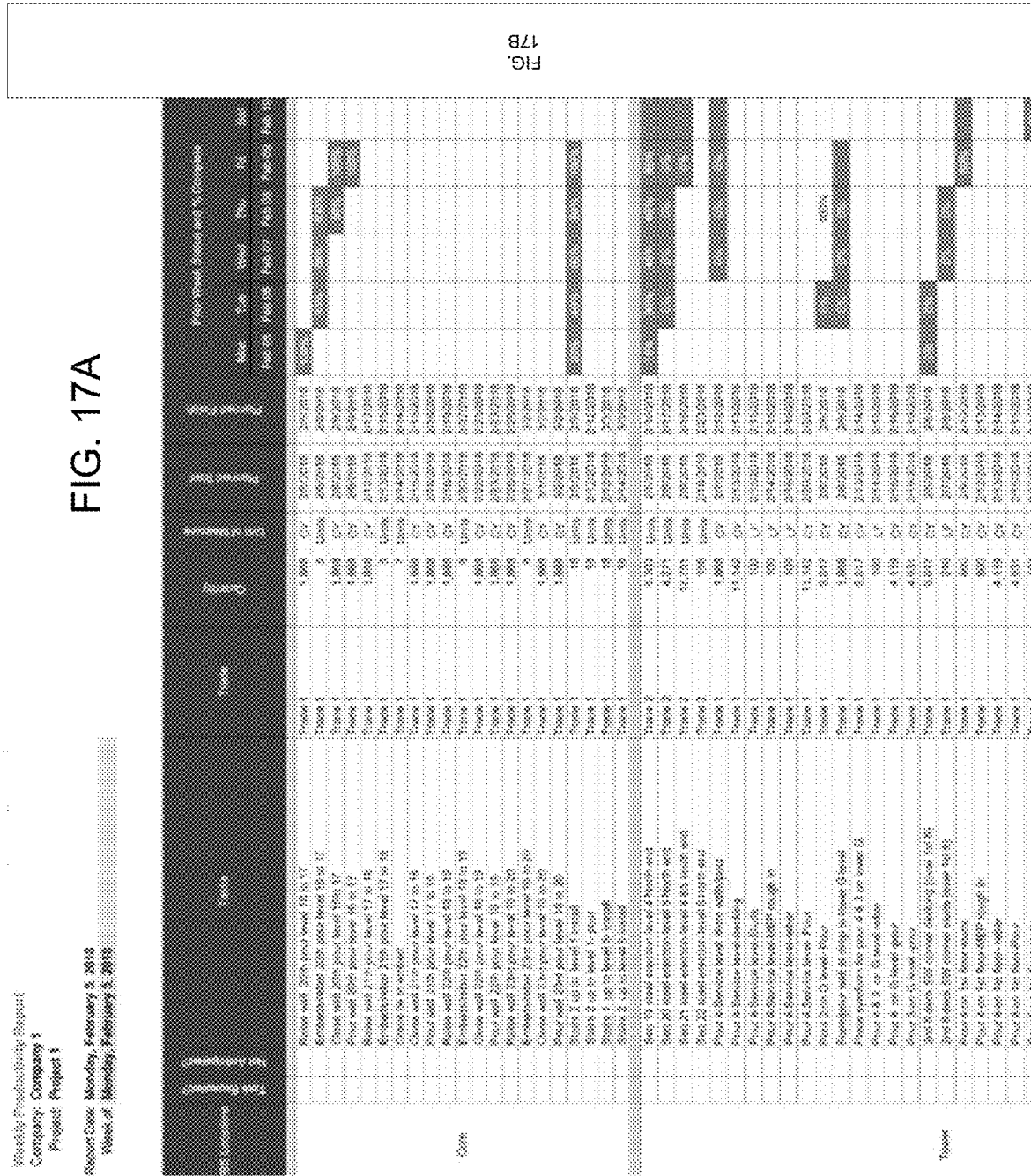

FIG. 18A

| Status | Description | Calculation | Icon |
|---|---|---|---|
| Started On Time | Task started on time, and the planned finish date has not passed. | Actual Start ≤ Planned Start AND Current date < Planned Finish | ▲ |
| Late Start | Task started late but the planned finish date has not passed | Actual Start > Planned Start AND Current Date < Planned Finish Date | ▲ |
| Has not Started | Task has not started but the planned finish date has not passed. | No Actual Start AND Current Date < Planned Finish Date | ◀ |
| Delayed | Task has started but is late. | Actual Start Exist AND Current Date > Planned Finish Date | ▲ |
| Critical Delay | Task has not started and the planned finish date is passed. | No Actual Start AND Current Date > Planned Finish Date | ◀ |
| Finished On Time | Task was finished on Time | Actual Finish ≤ Planned Finish | ⏰ |
| Finished Late | Task was finished later than the planned finish date | Actual Finish > Planned Finish | ⏰ |

COMPUTATION OF POINT CLOUDS AND JOINT DISPLAY OF POINT CLOUDS AND BUILDING INFORMATION MODELS WITH PROJECT SCHEDULES FOR MONITORING CONSTRUCTION PROGRESS, PRODUCTIVITY, AND RISK FOR DELAYS

FEDERALLY SPONSORED RESEARCH OR DEVELOPMENT

This disclosure was made with government support under CMMI 1446765 awarded by the National Science Foundation. The government has certain rights in the invention.

TECHNICAL FIELD

The present disclosure relates to construction site progress monitoring and planning, and more particularly, to computation of point cloud, as-built models for display and facilitation of user interaction with visualizations of construction progress monitoring and risk for delay.

BACKGROUND

The United States construction industry is a $1.1 trillion dollar industry with a forecasted growth of 10 to 12 percent for 2016 to 2018. Despite significant financial recovery over the past few years, the construction industry still exhibits significant inefficiencies, widespread cost overruns, and delays. Specifically, productivity levels have remained flat for two decades, while productivity in manufacturing has nearly doubled, as illustrated in FIG. 3.

According to a recent analysis by McKinsey & Company, 98% of mega construction projects, which range more than $0.5B, incur delays averaging 20 months with cost overruns of 80% on average. Several factors contribute to this lack of growth in productivity. For example, inadequate communications cause inconsistencies in reporting, making it difficult for contractors, subcontractors, and owners to maintain a common understanding of how projects are progressing. Flawed performance management with unresolved issues stack up because of lack of communication and accountability. Poor short-term planning also exists. Although firms are generally good at understanding what needs to happen in the next few months, firms struggle planning actions in the next week or two. Missed connections may also occur in which there are different levels of planning, from high-end preparation to day-by-day programs. If the daily work is not finished, planners need to know so that they can update priorities, but such information is often not available to them in real-time.

Furthermore, there exists insufficient risk management. Long-term risks may be considered, but the day-by-day risks on job sites are often not considered. Incomplete or inaccurate information often leads to poor decision making. While some companies manage to succeed, these problems and challenges are serious, systemic, and all too common in the construction industry.

BRIEF DESCRIPTION OF THE DRAWINGS

A more particular description of the disclosure briefly described above will be rendered by reference to the appended drawings. Understanding that these drawings only provide information concerning typical embodiments and are not therefore to be considered limiting of its scope, the disclosure will be described and explained with additional specificity and detail through the use of the accompanying drawings.

FIGS. 10A through 10C are images illustrating the impact of controlling the level of detail from low detail to high detail within a web-based interface according to various embodiments.

FIG. 10D is an image illustrating a point cloud height map according to an embodiment.

FIG. 10E is an image illustrating a point cloud in red green blue (RGB), with these colors arranged from top to bottom, according to one embodiment.

FIG. 10F is an image illustrating an octree used for pre-processing and point selection according to an embodiment.

FIG. 17A is a graph illustrating a productivity report with prior week point clouds, according to an embodiment.

FIG. 18A is a graph illustrating an at-risk location report organized by task based on work break down structure, WWP, and look-ahead schedule, according to an embodiment.

FIG. 23C is an image of an image-based legend for an advanced state-of-progress mode of the web-based interface according to an embodiment.

DETAILED DESCRIPTION

Figure 1:
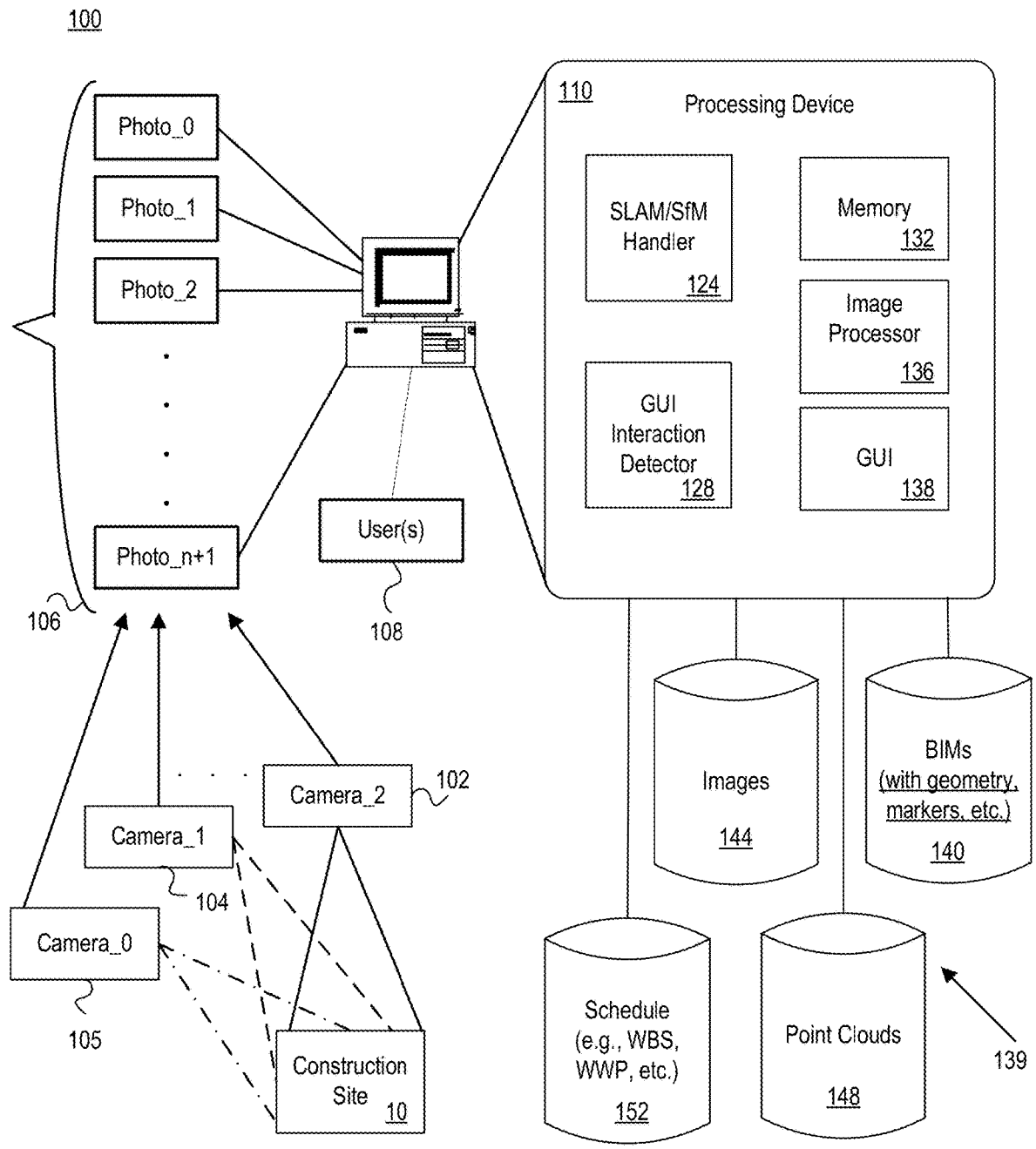
FIG. 1 is a diagram of a system for executing the disclosed modeling and visualization of a construction site according to an embodiment.

By way of introduction, the current disclosure provides access to actionable construction performance analytics to all project participants via transparent process views to project managers so that analytics may help to eliminate problems as soon as possible. The disclosed system and methods visually track and communicate project assignments, e.g., who does what work in what location, and enables efficient processes by preventing interferences among tens to hundreds of trades engaged in a construction project on a daily basis. By measuring progress deviations and risk in short-term plans, the disclosed system tests the reliability and predictability of the planned execution, and offers high flexibility for changes via web-based interfaces that facilitate visualization of 3D point clouds (e.g., "as-built" models of completed portions of constructions site) as compared against scheduling constraints. These measurements transform today's retroactive monitoring practices, which only look into finding deficiencies in the past, into proactive identification of potential performance problems. Pilot projects illustrate that visual, at-risk location reports, together with as-planned, color-coded building information models (BIM) integrated with schedule information, empower contractors to collaboratively address problems in coordination meetings, provide a realistic view of total costs and project durations, enable better decisions, and ultimately improve productivity. Surveys show that improving productivity by even ten percent may double a contractor's net profit.

The disclosed system and methods provide an end-to-end platform that offers actionable visual data analytics via schedule and task data, 3D BIMs, and images captured with unmanned aerial vehicles (UAVs) or ground cameras (e.g., consumer grade cameras, fixed time-lapse cameras, and smart phones cameras). Note that UAVs are also commonly referred to as drones, and both terms may be used interchangeably herein. A 3D BIM is a computer-prepared building model of a planned structure, such as an architect would prepare for generation of blueprints for a construction project. Schedule data, including the locations, start dates, and durations for a set of tasks, may be integrated with the 3D BIM by assigning elements in the BIM to tasks according to the locations of the elements and tasks. The BIM integrated with such scheduling data is called "4D BIM," wherein the four in the "4D" is the scheduling data.

In various embodiments, the system may include data capture, processing, and delivery via an online interactive interface accessible through desktop computers, laptop computers, and mobile devices such as smartphones and tablets. Using the collected images of the construction site, the system may build 3D point cloud models reflecting the actual state of work in progress. By integrating these point cloud models with 3D BIMs and a schedule, the system may measure progress and analyze risk for delay at each location. The intuitive 3D interface facilitates communication among work crews (e.g., contractors, sub-contractors, and owners), tracks who does what work in what location (e.g., location-based work crew assignments), and visually communicates performance problems, requests for information (RFIs), and quality control reports. The system may also facilitate visualization of which tasks are at risk for delay by assigning colors to elements of the BIM ("color-coding") and producing at-risk location reports to enable revision of short-term plans to head off delays at identified locations. Disclosed image-based 3D reconstruction may be ten times faster than current state-of-the-art tracking. The integration of 3D point cloud building models and construction schedule with actual 3D BIM, the visual data analytics solution including identification of at-risk locations, and an online 3D interface may function at low computational overhead, and thus facilitate user interaction via mobile devices such as smartphones, tablets, and the like.

In one embodiment, the system includes a processing device and computer storage coupled to the processing device. The computer storage may store a 3D BIM of a construction site, anchor images, each depicting a viewpoint having a 3D pose and containing features with known 3D positions with respect to the 3D BIM, and target images of the construction site with undetermined 3D position and orientation. Such target images are uncalibrated in not yet being registered to the 3D BIM. The 3D pose may be defined by a 3D position and orientation relative to the 3D BIM. The features may include at least one of structural points, edges, objects, or textured surfaces within the 3D BIM. The system may also include one or more 3D point clouds that depict the as-built conditions of the construction site, which may be derived from the anchor images or other images or 3D measurement devices. The system may also include a graphical user interface that displays images and point clouds with known 3D pose together with the BIM, enabling the user to compare as-built conditions to plans for the purpose of assessing progress towards task completion. The system may also include schedule data integrated with the BIM to further facilitate the assessment of task progress.

In various embodiments, the processing device may initialize a set of calibrated images, which have a known 3D pose relative to the 3D BIM. The processing device may detect target features within the target images and determine matches between the target features and the features of the anchor images, to generate a set of matching features. The processing device may further determine a subset of the target images that have at least a threshold number of the matching features and select a first image from the subset of the target images having the largest number of the matching features. The processing device may further execute an image-based reconstruction algorithm using the first image and the anchor images to calibrate the first image to the BIM and generate an initial 3D point cloud model of the construction site.

The processing device may further incrementally repeat the last few steps to identify a second image from the subset of the target images and perform, starting with the initial 3D point cloud model and using the second image and the anchor images as constraints to the image-based reconstruction algorithm, 3D reconstruction to generate an updated 3D point cloud model of the construction site. The second image is selected as the target image that is not in the calibrated images set (e.g., not an anchor image) and has the most matching features with the calibrated image set, with the number of matching features being at least some threshold number. The processing device may further display a visual instantiation of the updated 3D point cloud model of the construction site in a graphical user interface of a display device, wherein the visual instantiation of the updated 3D point cloud model includes 3D points derived from at least the first image and the second image aligned to the 3D BIM.

In other embodiments, a system includes a processing device and a graphical user interface (GUI) executable by the processing device and accessible by a user device over a network. The processing device may be configured to retrieve a 4D BIM of a construction site, wherein the 4D BIM includes a 3D BIM that reflects which elements are to be constructed by a given date according to a construction schedule. The processing device may further retrieve a first 3D point cloud model of a construction site with known 3D pose relative to the 3D BIM, wherein the 3D pose is composed of a 3D position and orientation relative to the 3D BIM. The processing device may retrieve a second 3D point cloud model generated at a later time than the first 3D point cloud model with known 3D pose relative to the BIM. The processing device may further execute an alignment tool to display, in the GUI, a visual instantiation of the first 3D point cloud model and a visual instantiation of the second 3D point cloud model. The processing device may further receive a selection, through the GUI, of at least three points of the first 3D point cloud model and of the second 3D point cloud model that mutually correspond. The processing device may further align, using the alignment tool, the first 3D point cloud model with the second 3D point cloud model based on the at least three points. The processing device may also display, in the GUI, at least one of the first 3D point cloud model or the second 3D point cloud model superimposed on the 4D BIM to illustrate as-built construction progress over time with reference to the construction schedule.

FIG. 1 is a diagram of a system 100 for executing the disclosed modeling and visualization of a construction site 10. The system 100 may include a plurality of cameras 102, 104, and 105, which may represent a multitude of cameras that may take photos that create images of the construction site 10 at different times. At least some of the cameras may be designated as anchor cameras from which reconstruction may be performed. The cameras may be standard mobile devices, UAV cameras, or a digital camera that embeds metadata (such as exchangeable image file format (EXIF) data) within the digital images taken.

The system 100 may further include a plurality of photo images 106 generally referred to herein as digital images or simply images taken by the cameras of the construction site 10 (e.g., any kind of structure being built). The images 106 may be unordered and in any size, including one image up to hundreds or more images.

The system may further include one or more users 108 and a processing device 110. The users 108 may facilitate gathering the images by taking the pictures with the cameras and inputting them into the processing device 110 through known storage or transfer devices. Alternatively, or additionally, the cameras 102, 104, 105 may stay in a certain location to take pictures on a regular schedule, and in an automated fashion, upload the images to the processing device, without user intervention. The images 106 may be uploaded directly, wirelessly, remotely over a network, and/or via the cloud.

The camera locations may be varied and provide views of the construction site 10 at different angles or perspectives. Some cameras may, therefore, capture information of the construction site that other cameras may miss. Adding images from the plurality of cameras may, however, allow for a more complete compilation of progress of construction of a building or other structure. Images may be added to the processing device 110 incrementally over time.

The processing device 110 may include a handler 124 for simultaneous localization and mapping (SLAM) algorithms, structure-from-motion (SfM) algorithms and the like, a graphical user interface (GUI) detector 128, memory 132, an image processor 136, and a graphical user interface (GUI) 138, among other components. The processing device may further include computer storage 139 working in conjunction with the memory 132 to store and provide to the processing device data and instructions. The computer storage 139 may include, but not be limited to, a building information model (BIM) 140, images 144, 4D visualizations, and scheduling information 152 such as work breakdown structure (WBS), weekly work plan (WWP), and the like. These may be databases that are joined into one database and/or otherwise include data that are related to each other through storage methodologies.

The BIM 140 may be a computer aided design (CAD) or digital architectural drawings containing computer-rendering information generally referred to as a mesh that corresponds to different model elements of the construction site. Model elements may be 3D drawings of walls, columns, or other structures and features to be constructed, together with data to inform the construction process, e.g., pertaining to job site location, construction materials, and constraints. This mesh may be designed to scale of an actual construction site, capable of correlation to portions of images of the construction site during construction, and may employ a hierarchical octree such as will be discussed on more detail. Such correlation makes possible registering and alignment of the images 106 against the 3D BIM and association of the registered images with the scheduling information 152. When the scheduling information 152 is integrated with a 3D point cloud model of the construction site 10, the processing device 110 may form 4D visualizations for user viewing through the GUI 138, indicating building progress for monitoring and planning purposes.

The image processor 136 may help perform the modeling in conjunction with the handler 124 and, in some situations, the GUI interaction detector 128. The GUI interaction handler 128 may detect points within the images 106 through the GUI 138, which points may be correlated by the image processor 136 to locations with one of the BIMs 140. The processing device 110, e.g., the image processor 136, may align the images to the BIM during point cloud generation to enable a suite of visualization tools, in which point clouds and 4D BIM may be explored in 4D, evaluated in terms in terms of progress and building-plan deviations, and imbued with photorealistic architectural renderings. The benefits of the system 100 are relevant for both professional purposes and also customer interfaces.

Figure 2A:
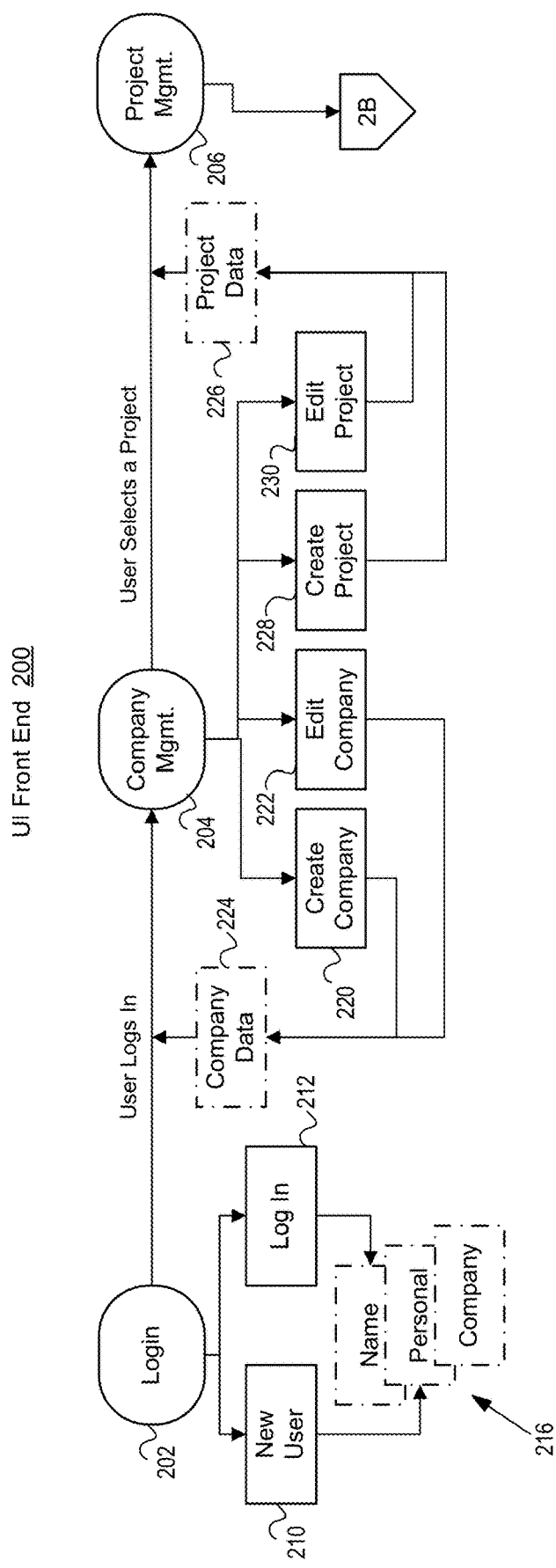
FIGS. 2A and 2B are a flow diagram illustrating a flow of the disclosed methods for modeling and visualization of a construction site.
Figure 2B:
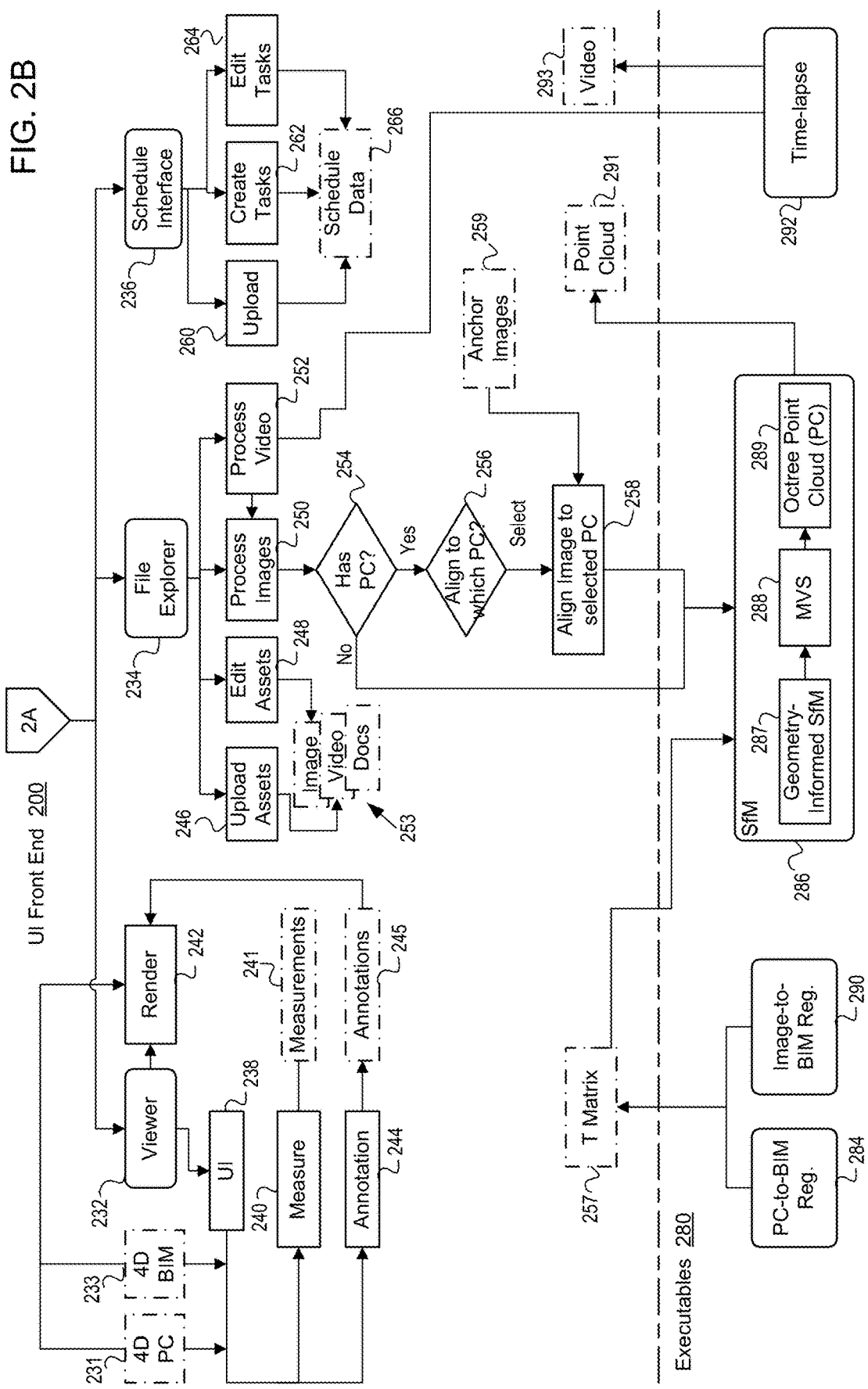
Figure 3:
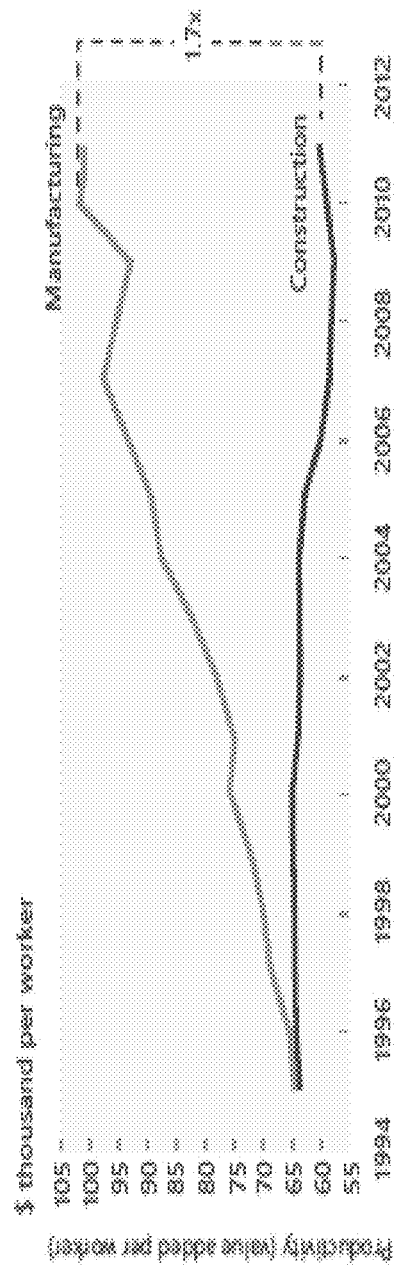
FIG. 3 is a graph illustrating productivity in construction in thousands of dollars per worker since 1994.

FIGS. 2A and 2B are a flow diagram illustrating a flow of the disclosed methods for modeling and visualization of a construction site. The flow diagram is disclosed in connection with an expanded description of the system 100 of FIG. 1. The GUI 138 of the system 100 may include a UI front end 200 and the storage 139 may include a set of executables 280, e.g., instructions for executing particular functions with reference to input data to generate certain output data to be stored and/or displayed. The blocks with a dashed-dotted pattern may be understood as database items, and therefore could be stored in one or more databases of the computer storage 139, and may be stored in association with BIM-based and point-cloud based images or data.

In various embodiments, the methods or actions associated with or enabled by the flow of FIGS. 2A and 2B may be performed by processing logic that may comprise hardware (e.g., circuitry, dedicated logic, programmable logic, microcode, etc.), software (such as instructions run on a processing device), firmware, or a combination thereof. The processing logic may render images and receive data through a user interface that may be a web-based user interface, a stand-alone user interface, or a combination thereof.

The UI front end 200 may include a login page 202, a company management page 204, and a project management page 206. Within the login page 202, a user may create a new user (210) and log in using new user credentials (212). The company management page 204 may receive company data 224 and respond to user selection and information inputs to create a company (220), edit a company (222), create a project (228), and edit a project (230). Information used to create a company may be saved within a database for the company data 224 and information used to create a project may be saved within a database for project data 226.

In various embodiments, the project management page 206 may provide a number of different options for viewing planned construction projects in association with 3D BIM, 3D point clouds, and scheduling information, along with a number of user interaction options as will be explained in more detail. In performing these functions, the system 100 may execute a set of executables 280, which may be stored within the computer storage 139 and at least partially loaded into the memory 132 when executed by the processing device 110.

With additional reference to FIG. 2B, the project management page 206 may include multiple page sections, including a viewer 232, a file explorer 234, and a schedule interface 236. In one embodiment, the viewer 232 may include a set of section components for performing various functions, including but not limited to, a user interface component 238, a measure component 240, and an annotation component 241. The user interface component 238 may facilitate rendering images and/or visualizations for annotation, including, for example, a 4D BIM 231, a 4D point cloud 233 (including octree data that will be discussed in more detail), discrete 3D point clouds, resultant point clouds with registered images, and the like. The 4D point cloud 233 may be understood to be a set of 3D point clouds over a time period, and thus tracks changes to the structure of the construction site 10. The 4D BIM 233 may be the original construction site plan (building information model) with integrated scheduling information, or an updated plan created after construction began.

In various embodiments, the measure component 240 may interact with the BIM-based and point cloud-based visualizations rendered within the GUI 138 in order to facilitate determining distance, angles, and volumes of sub-parts and structures of the construction site 10. The annotation component 241 may facilitate the addition of annotations 247 (e.g., text boxes, comments, lines, geometric shapes, and the like) on top of the BIM-based and point cloud-based visualizations. The annotations 247 may allow users to highlight and identify areas of the construction site that may need attention, for example, are behind schedule or carry some additional risk.

The UI front end 200 of FIGS. 2A and 2B may further include the file explorer 234, which is a page section of the project management page 206. The file explorer 234 may enable users to upload assets 253 (246), edit the assets 253 (248), process images (250), and process video (252), as will be explained. The assets 253 may include images, videos, and documents. A time-lapse executable 292 may generate raw video 293, which may be uploaded during image-to-BIM registration (e.g., execution of a image-to-BIM registration executable 290) in order to process the raw video 293. The video may be processed at block 252 in order to convert the video into a series of images, which in turn may be processed as other images would be starting with block 250, which may also be a point cloud generation option for a user in one embodiment.

In various embodiments, the system 100 may respond to user-initiated requests to process images (whether through upload, submission of individual images, or video processed to generate a series of images) into either an existing point cloud or to generate a new point cloud as follows (250). In one embodiment, with reference to each image, the system 100 may determine whether there exists a point cloud associated with the project, e.g., a 3D or 4D point cloud (254). If there is not point cloud, then the image may be sent to a structure-form-motion (SfM) executable 286 (or similar executable for other image-based processing reconstruction algorithm) for point cloud generation and optional alignment to a BIM, which will be described in more detail. If there is one or more point clouds, then the system 100 may further determine to which of available point clouds the image is to be aligned (assuming more than one point cloud exists for the construction site 10), where the most recent may be provided as default if a user does not choose otherwise (256). The system 100 may align the image to the selected point cloud anchor images 259, which will be discussed in more detail later on (258). For example, anchor images 259 may be initialized from calibrated images for which a 3D pose is already known with relation to the selected point cloud.

In various embodiments, the SfM algorithm executable 286 may include a geometry-informed SfM algorithm 287, a multi-view stereo (MVS) code 288, and an octree point cloud 289. The geometry-informed SfM algorithm 287 may analyze and base creation of as-built, sparse point clouds using aspects of the geometry of the construction site derived from the BIM. The MVS code 288 may generate a dense point cloud from the sparse point clouds by, from the calibrated images produced by the SfM algorithm, grouping sets of images according to viewpoint and matching patches centered about each pixel in each image to patches in the other images, for example. The octree point cloud 289 may provide a nested octree structure onto which the dense point cloud may be organized. For example, a modifiable octree structure may be employed for ordering and fast searching of large-scale point clouds in a convenient manner, as will be discussed in more detail.

The registration may map the point cloud to real world site coordinates and the registration may occur before or during the 3D point cloud generation. For example, the registration may map an alignment between images and a BIM in one example, and map an alignment between a point cloud and a BIM in another example. If the images are aligned to a BIM to which the point cloud is also aligned, the images are thereby also aligned to the point cloud. In one embodiment, the processing logic may execute a point cloud-to-BIM registration executable 284 to generate a transformation matrix 257 that encodes the alignment of the point cloud to physical coordinates of the construction site. Such BIM-registered images may then act as constraints to the SfM algorithm executable 286 for use in generating the point cloud data 291. Specifically, the SfM algorithm executable 286 may incorporate the BIM-registered images to enable SfM-related processing to generate the point cloud data 291, which is made up of as-built information of the construction site. In one embodiment, the transformation matrix 257 is a 3×4 matrix that, when multiplied by a 3D point (represented as [x y z 1] coordinates), applies a translation, rotation, and scaling to move the 3D point from its original coordinates to the BIM coordinates, which represent the site coordinates.

In one embodiment, if the system 100 has stored a point cloud and a BIM that are not aligned, the system 100 may display the image and the point cloud to a user through the GUI 138 with the user interface component 238, e.g., through execution of the image-to-BIM registration executable 290. The user may then be able to select points (e.g., at least three points through a web interface or other UI) on the BIM and on the point cloud that mutually correspond (e.g., identify identical locations of these at least three points). The processing device 110 may then transform the point cloud such that the point cloud is aligned with the BIM based on the at least three corresponding points. Corresponding points may be saved to the transformation matrix 257 in one embodiment, in order to store data associated with transformation between BIM and the point cloud.

In another embodiment, if the system 100 has one or more existing point clouds and is to align a new set of images to one of these existing point clouds, the system 100 may execute the SfM executable 286 using the images from the existing point cloud as anchor images 259. If the point cloud with these anchor images 259 is aligned to the BIM, then the new point cloud will also be aligned to the BIM. In a further embodiment, the interface component 238 may further receive, from a user, corresponding points between the image and the BIM on which to based alignment and reconstruction. These embodiments will be described in more detail under the below section for 3D reconstruction and alignment.

In various embodiments, the schedule interface 236 may facilitate the uploading of tasks (260), the creation of new tasks (262), and the editing of existing tasks (264), all of which may generate schedule data 266. The schedule data 266 may be integrated with a 3D BIM to create a 4D BIM, e.g., a 3D BIM that reflects which elements are to be constructed by a given data according to a construction schedule. More specifically, the schedule data 266 may be integrated with a 3D BIM by assigning elements of the 3D BIM to corresponding tasks, thus creating the 4D BIM. The 4D BIM may be used to illustrate visually which tasks will be performed at a given time, who is scheduled to work in which locations, and any analytics information such as which locations are behind schedule or at risk for delay. These various features of the scheduling data will be illustrated and discussed in more detail.

Image-Based 3D Reconstruction and Alignment to BIM

Figure 4:
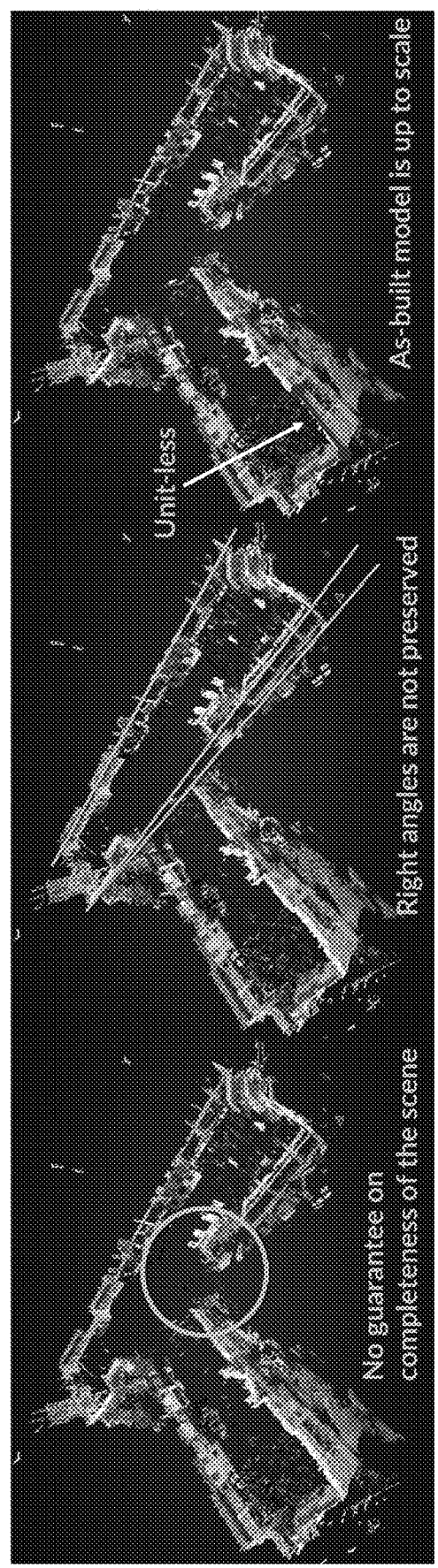
FIG. 4 is an image of a construction site that illustrates challenges associated with structure-from-motion modeling of the construction site, according to one embodiment.

FIG. 4 is an image of a construction site that illustrates challenges associated with structure-from-motion modeling of the construction site, according to one embodiment. The disclosed system 100 and related methods differ from standard structure-from-motion (SfM) algorithms. In early research, a pipeline of image-based reconstruction procedures including SfM and multi-view stereo (MVS) algorithms were used to generate sparse and then dense point clouds, and subsequently transform the dense point clouds into the BIM coordinate system. However, experiments show that problems are observed with employing standard SfM algorithms. For example, there is no guarantee as to the completeness of the point clouds even though images may be captured from the entirety of a scene (see first image). Further, current algorithms may produce drift in long distances and may result in projective reconstructions which are not meaningful for engineering applications (see middle image). Additionally, the resulting as-built, point cloud models are often up-to-scale, and thus without units, and still have to be transformed into a site coordinate system before being useful for engineering applications.

Once the point cloud models are generated, the user identifies a number of corresponding feature points between the point cloud and the BIM, and brings the feature points into alignment. To recover seven ("7") degrees of freedom for this transformation (3 rotation, 3 translation, 1 uniform scale), previous work employed a closed-form quaternion solution to the similarity transformation problem. The challenge in this process is that the user has to select the features from whatever 3D points that are reconstructed as part of the point cloud. If a user is interested in selecting the corner of a wall or column that does not have any 3D representation (either because the surface is flat, or because the point cloud is incomplete), there is no mechanism to select the feature via the images that are registered with respect to the point cloud model.

A previous system achieved more accurate and complete point clouds due to better camera registration and higher success in localization of images into the underlying base point cloud by leveraging the 3D BIM, which may include registered GPS locations from the construction site. Despite promising results, this previous system still has not overcome several challenges. For example, the previous system required the user to randomly and manually identify an anchor camera, select the correspondence between the 3D BIM, and the anchor camera, and initiate the 3D reconstruction process. Hence, the choice of the anchor camera is left blindly to the user, who may have little guidance or intuition for which image to choose. Furthermore, the previous system identified a subset of images with high overlap with the anchor camera (via a homography transformation) and used the images that have small 3D baselines for initializing the 3D reconstruction. This strategy, when used for triangulations of the 3D points via Direct Linear Transform (DLT), results in numerical instability, produces a sparse 3D model as the initial reconstruction, and typically breaks down after a few steps in the incremental bundle adjustment optimization procedure. Additionally, the user needed to supervise the entire process because the reconstruction could fail due to the challenges introduced in identifying the subset of images. Such failures required the user to again manually align a new anchor camera with the 3D BIM to resume the process. For a dataset of about 100-150 images, there could be 6-10 anchor cameras. In addition to the heavy user input, the user had to wait until the algorithm failed and then provide a new anchor camera. The selection of a new anchor camera extended the computation of SfM algorithm by a few orders of magnitude and required constant supervision by the user.

In one embodiment, the computer storage 139 may store a 3D BIM of a construction site, anchor images, each depicting a viewpoint having a 3D pose and containing features with known 3D positions with respect to the 3D BIM, and target images of the construction site with undetermined 3D position and orientation. The 3D pose may be defined by a 3D position and orientation relative to the 3D BIM. The features may include at least one of structural points, edges, objects, or textured surfaces within the 3D BIM. The system 100 may also include one or more 3D point clouds that depict the as-built conditions of the construction site, which may be derived from the anchor images or other images or 3D measurement devices. In various embodiments, the GUI 138 may display images and point clouds with known 3D pose together with the BIM, enabling the user to compare as-built conditions to plans for the purpose of assessing progress towards task completion. The system 100 may also include scheduling data integrated with the BIM to further facilitate the assessment of task progress.

In various embodiments, the processing device 110 may determine the 3D pose of yet-undetermined target images and produce a 3D point cloud from the images with a determined 3D pose. In one embodiment, the processing device may determine 3D pose using a subset anchor images. The subset of anchor images may be chosen from all available calibrated images with known 3D pose using the GUI 138 and which may be stored in the images database 144. For example, the subset of anchor images may be identified by the date at which the anchor images were photographed (e.g., using the most recent photos), or by matching features in the target images to the calibrated, anchor images.

Additionally, the processing device 110 may detect target features within the target images and determine matches between the target features and the features of the anchor images, to generate a set of matching features. The processing device 110 may further determine the subset of the target images that have at least a threshold number of the matching features, and may tag the subset of target images as such within the images database 144. The threshold number of matching features may be a predetermined threshold number (e.g., 50, 100, 150, 200, or more). The processing device 110 may further select a first image from the subset of the target images associated with one or more of the anchor images, the first image having the largest number of matching features. The processing device 110 may further execute an image-based reconstruction algorithm using the first image and the anchor images to calibrate the first image to the BIM and generate an initial 3D point cloud model of the construction site.

In various embodiments, to execute the image-based reconstruction algorithm (e.g., SLAM, SfM), the processing device 110 may perform one or more operations, in one or more combinations of code executions. For example, the processing device 100 may triangulate 3D points from matched features within the anchor images. The processing device 110 may further obtain an initial estimate of the 3D pose of the first image by determining the 3D pose that minimizes the sum of distances between the projection 3D points corresponding to matching features and the 2D positions of the matching features in the first image, which may also be the performance of re-sectioning of the first image. The processing device 110 may further triangulate the subset of matching features between the first image and anchor image that are not already represented in the 3D point cloud. The processing device 110 may further refine the estimate of the intrinsic camera parameters (e.g., focal length and radial distortion) of the first image, the 3D pose of the first image, and the 3D positions of triangulated matching features to minimize the reprojection distance of the 3D points and their corresponding matching features in respective images, which may also be referred to as bundle adjustment of the first image and the anchor images. The 3D poses of the anchor images may be constrained to remain unchanged by the image-based reconstruction algorithm After reconstruction, the first image may be added to the set of calibrated images, along with the anchor images.

The processing device 110 may further incrementally repeat the last few steps to identify a second image from the subset of the target images that has a next largest number of matching features. The processing device 110 may then perform, starting with the initial 3D point cloud model and using the second image and the anchor images as constraints to the image-based reconstruction algorithm, 3D reconstruction to generate an updated 3D point cloud model of the construction site. This processing may also be referred to as incremental 3D reconstruction. In various embodiments, the second image may be selected as the target image that is not in the calibrated images set (e.g., anchor images) and has the most matching features with calibrated images, and where the first image is now considered a part of those calibrated images, and thus excluded. To perform the image-based reconstruction algorithm, the processing device 110 may further perform the above-listed set of operations, but now to include the second image and the calibrated as constraints and for use to build on the initial 3D point cloud and generate the updated 3D point cloud model. The processing device may further display a visual instantiation of the updated 3D point cloud model of the construction site in a graphical user interface of a display device, wherein the visual instantiation of the updated 3D point cloud model includes at least the first image and the second image aligned to the 3D BIM.

After all target images are calibrated or no more uncalibrated target images have sufficient matching features to be calibrated, the anchor images may be removed from the calibrated set and 3D points triangulated from only the calibrated target images to create a sparse 3D point cloud, e.g., a new 3D point cloud. The sparse 3D point cloud may then be stored by the system and displayed by the system in the graphical user interface, e.g., the GUI 138. The calibrated target images may also be displayed. Since the 3D pose of the anchor images is known (e.g., the position and orientation of anchor images relative to BIM is known), the 3D pose of the calibrated target images is also known with respect to the BIM. The calibrated target images may be undistorted using the estimated intrinsic camera parameters, and the undistorted images, intrinsic camera parameters, 3D poses, detected features, and feature matching data of the target images may be stored, e.g., in the computer storage 139 (FIG. 1). The newly calibrated target images may be added to the set of all anchor images and may be used to facilitate processing of any other images with undetermined pose. Storing the features and feature matches is not necessary but may reduce the computation time for future processes.

The calibrated target images may be further processed to produce a dense point cloud using a multi-view stereo (MVS) algorithm, e.g., via execution of the MVS executable 288. The MVS algorithm may use the 3D pose of the calibrated target images, the content of the calibrated target images, and, optionally, the matching features and corresponding 3D points to generate a larger number of 3D points. In one embodiment of the MVS algorithm, the processing device 110 may execute the MVS executable 288 to determine, for each calibrated target image, a number of other images that have a similar viewpoint of the scene. The processing device 110 may further match patches centered on each pixel in the target image to patches in another image of the number of other images. The processing device 110 may further triangulate 3D points using the matching patches. The 3D points may then be accumulated across images and any of a number of processes used to remove points that have low photometric scores or are inconsistent with other points, e.g., based on occlusion. Finally, a 3D mesh may be constructed from the 3D points using any of a number of processed points to fit 3D surfaces to 3D points, including but not limited to Poisson surface reconstruction.

In various embodiments, the accuracy and completeness of image-based reconstruction may be enhanced by using 3D BIM as a constraint to the image-based reconstruction algorithm (e.g., SLAM, SfM, and the like). The disclosed BIM-assisted SfM procedure together with application of the SfM algorithm improves completeness and accuracy in 3D reconstruction in ways that will be discussed. To address the problems with previous work, the new SfM algorithm may be informed by a priori knowledge of scene geometry. Such geometry includes, but is not limited to, existing 3D building models (e.g., 3D BIM), 2D fiduciary markers with surveyed 3D coordinates, and surveying benchmarking points. Two-dimensional (2D) fiduciary markers are encoded image codes with known patterns that can be recognized through image processing. While 2D fiduciary markers can be printed out on paper or other medium and easily placed around the construction site, the surveying benchmarking points need a professional surveyor with equipment to identify. For example, a benchmark is generally an existing item that will likely remain positioned without shifting for many, many years, as a stable elevation point. A surveyor may calculate, using surveying equipment, a precise location of the benchmark for use in determining other locations in relation to the benchmark.

In one embodiment, the processing device 110 may display a target image to the user that cannot be calibrated through feature matches together with the BIM. The user may then indicate three or more 3D coordinates on the BIM and corresponding 2D coordinates on the target image. The processor may then determine the 3D pose of the target image using the corresponding points and with use of one of a number of point-in-perspective (PnP) algorithms, e.g., the Efficient PnP (EPnP) algorithm. The image may then be added to the calibration set and processing to determine the 3D pose of any remaining uncalibrated target images may resume.

Figure 5A:
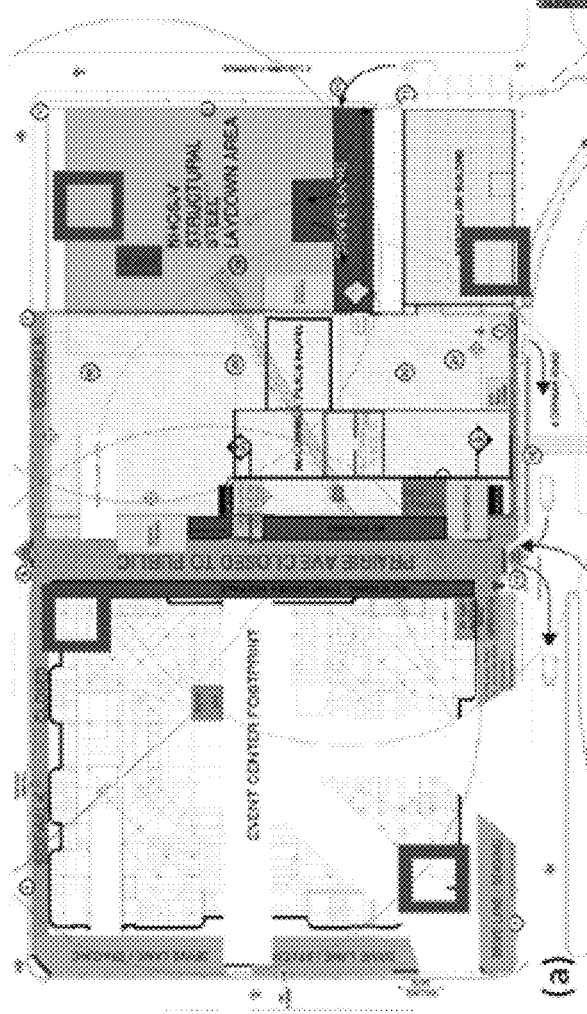
FIGS. 5A and 5B illustrate use of a graphical user interface to match fiduciary markers used for registration of point clouds or to associate a point cloud to a building information model (BIM) according to various embodiments.
Figure 5B:
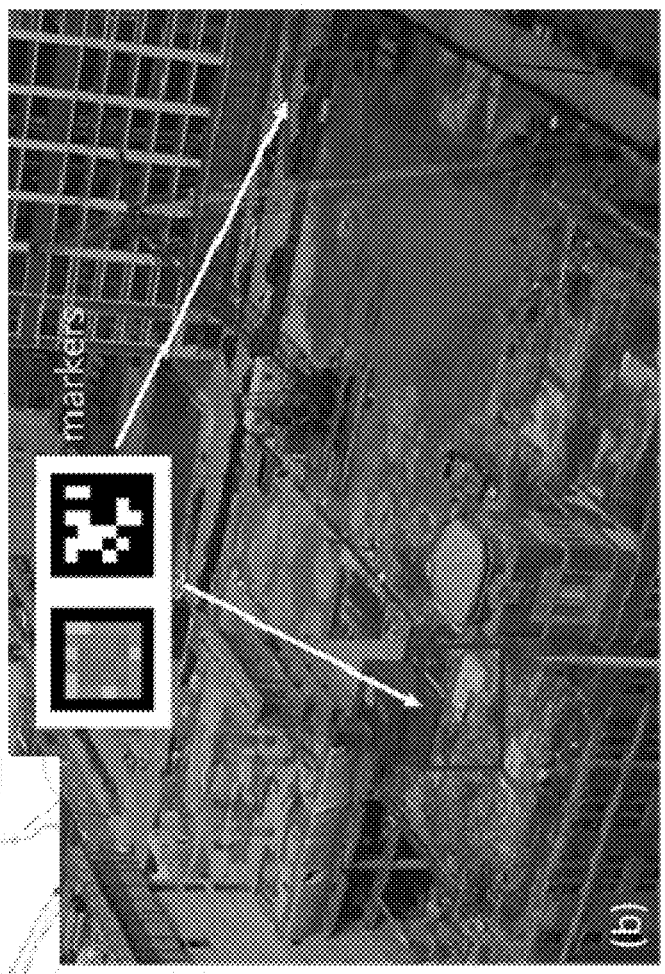

In various embodiments, during incremental reconstruction, the system 100 may transform the SfM algorithm into a constraint-based SfM algorithm by using the images associated with other anchor cameras as constraints. Note also that the disclosed methods do not necessarily need to rely on supervised 3D to 2D registration on anchor cameras. Different from BIM-driven SfM, the disclosed methods may detect site-registered fiduciary markers and surveying benchmarks, automatically solve for registration, and automatically execute the entire 3D reconstruction. For example, the fiduciary markers may be automatically detected during the point-cloud-generating process and the registration may be performed with at least three or more correspondences with the BIM to solve the similarity transformation between two coordinate systems as illustrated in FIGS. 5A and 5B.

Figure 6:
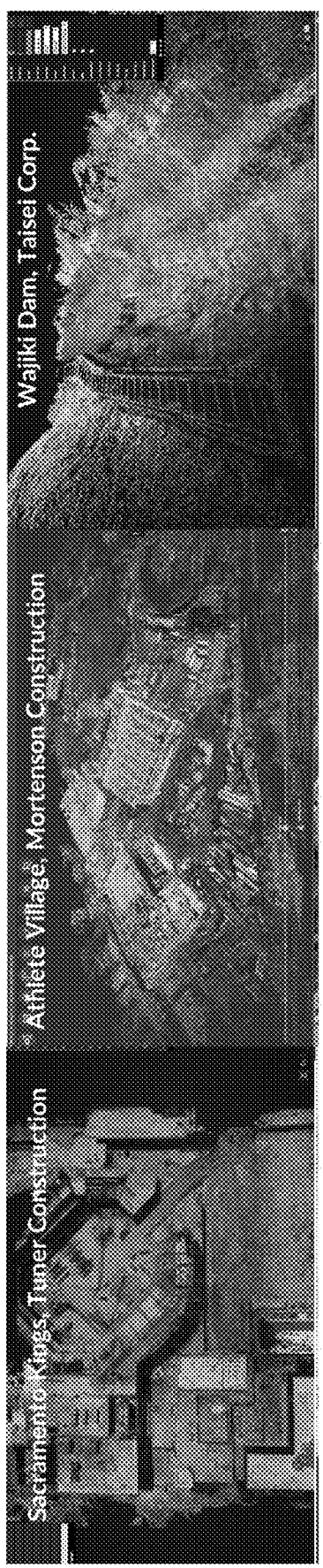
FIG. 6 is a set of images illustrating three-dimensional (3D) point clouds generated using images captured with a drone camera on the following jobsites, taken from the left to right: $500M Sacramento Kings stadium project in Sacramento, Calif. with Turner Construction; Athlete Village in Minneapolis, Minn. with Mortenson Construction; Wajiki Dam in Koji, Japan with Taisei Corporation.
Figure 7:
FIG. 7 is a set of images illustrating 3D point clouds generated using images captured with a drone camera on the following job sites, taken from left to right: Little rock project in Denver, Colo. with W.E. O'Neil construction; Zurich Insurance Company's headquarter project in Chicago, Ill. with Clayco Corp.; and McCormick Place hotel and stadium project in Chicago, Ill. with Clark Construction.

FIG. 6 is a set of images illustrating three-dimensional (3D) point clouds generated using images captured with a drone camera on the following jobsites, taken from left to right: $500M Sacramento Kings stadium project in Sacramento, Calif. with Turner Construction; Athlete Village in Minneapolis, Minn. with Mortenson Construction; Wajiki Dam in Koji, Japan with Taisei Corporation. FIG. 7 is a set of images illustrating 3D point clouds generated using images captured with a drone camera on the following job sites, taken from left to right: Little rock project in Denver, Colo. with W.E. O'Neil construction; Zurich Insurance Company's headquarter project in Chicago, Ill. with Clayco Corp.; and McCormick Place hotel and stadium project in Chicago, Ill. with Clark Construction.

In one embodiment, an offline desktop interface may be provided for users, with access to the system 100, to bring a point cloud and the images that generated the point cloud into alignment with the BIM. This alignment may be performed by selecting pairs of corresponding points from the point cloud and BIM. A point on the point cloud may be selected with the aid of an image that views the point (e.g., an anchor image if this point cloud is used for alignment later).

In one embodiment, to perform the incremental 3D reconstruction, the processing device 110 may execute instructions to, for each second image of the plurality of second images, display, in the web interface, the 3D BIM and the second image. The processing device may further receive a selection, through the web interface, of at least three points of the 3D BIM and the second image that mutually corresponds, and solve a PnP algorithm between the second image and the at least three points of the 3D BIM to determine the 3D pose of the second camera.

In another embodiment, drawing the correspondence is performed by the system 100 without user interaction, e.g., with processing logic performing incremental 3D reconstruction. To do so, the processing logic may execute instructions to, for each second image of multiple second images corresponding to additional target images, detect a set of locations corresponding to site-registered fiduciary markers and surveying benchmarks in the second image. The processing logic may further register the second image using at least three locations of the set of locations corresponding to BIM locations within the 3D BIM, and solve a PnP algorithm between the second image and the at least three locations in the 3D BIM to determine the 3D pose of the second image. In one embodiment, one or more of the executables 280 may be the source of the instructions executed by the processing logic.

Figure 8:
FIG. 8 is a set of images from within a web-based interface illustrating registration of BIM (or point clouds) with 3D point clouds according to an embodiment.

FIG. 8 is a set of images from within a web-based interface illustrating registration of BIM (or point clouds) with 3D point clouds according to an embodiment. In some cases, an already reconstructed 3D point cloud might be available to the user or laser scanners may be used to generate the models. For such cases, the system 100 may provide a web-based interface that allows the point cloud and BIM (or new point cloud) to be brought into alignment after receiving indications through the web-based interface of corresponding points. For example, a user may indicate certain points on the point cloud corresponding to certain points on another point cloud or on a BIM. Point cloud and new point cloud alignment may facilitate the alignment of point clouds over time. An alignment tool (e.g., with execution of the point cloud-to-BIM registration executable 284) may be used in association with the web-based interface when newer point clouds are not automatically aligned to the old point cloud and when newer point clouds are generated from other software or from a laser scan. Here, the interface illustrated in FIG. 8 is designed to assist the user in interacting with the BIM and point cloud (or with the point cloud independently) and manually provide the matching correspondences across the two models. In one embodiment, the processing logic may execute instructions from the point cloud-to-BIM registration executable 284 to perform registration of BIM (or point clouds) with a 3D point cloud.

Online Interactive 3D Interface

Note that the interface of the system may interactively display the BIM, project schedule, point cloud data, images, other project information (e.g., specifications) and the produced analytics on actual and potential performance deviations while accounting for computational power and connectivity bandwidth by using a nested octree data structure for point clouds on mobile devices such as smartphones and tablets.

The main challenges that are addressed in visualizing integrated BIM and as-built point clouds in a web-based environment with limited memory and bandwidth are (1) techniques for handling, interacting with, presenting, and manipulation of large-scale point clouds; (2) techniques for displaying polygonal meshes, e.g., the BIM, together with textured point clouds and high-resolution images; and (3) the deployment of fast and intuitive analytical tools.

In various embodiments, a modifiable octree data structure may be employed for ordering and fast searching of large-scale point clouds in a convenient manner. An octree is a general tree data structure that may be used in computer graphics to represent 3D space by recursively dividing the space into eight octants and that includes a tree-like hierarchy. The octree may subsample the point cloud and store sets of points at octree nodes such that the union of all point sets stored in the octree forms the original point cloud. The point sets of a level down the hierarchy enhance the point cloud represented by the union of the point sets of higher levels of the tree-like hierarchy. This nested octree representation facilitates the rendering process, as the number of points projected to the same pixel on the screen will be reduced by using the different hierarchical levels of detail the point cloud, and from those points only one representative point may be needed to fill the pixel on the screen. Furthermore, the other octree points may only be displayed when the field of view corresponds to the particular level. To facilitate interaction and manipulation of the point cloud, after user selection, the selection point is inserted into the octree based on the closest points, and is tracked down the hierarchy to find the position of the closest points. This strategy takes only about two seconds for a point cloud with density of 10 million points.

The disclosed system may employ a web graphic library (e.g., WebGL) viewer with functionalities so that users can browse through a point cloud through a first person view. The user may pan, rotate, move, and fly through the point cloud to explore the scene in detail. As the user moves closer, the system 100 may automatically load the points inside the view to reduce the loading speed by not needing to load all points for detailed views initially. The functionalities of this viewer are listed below. This may significantly reduce drawing on processing resources, e.g., processing bandwidth, power, and the like, and facilitate loading such scenes into lower bandwidth-capable and lower processing-capable devices such as mobile, hand-held devices, and other such computing devices.

Figure 9A:
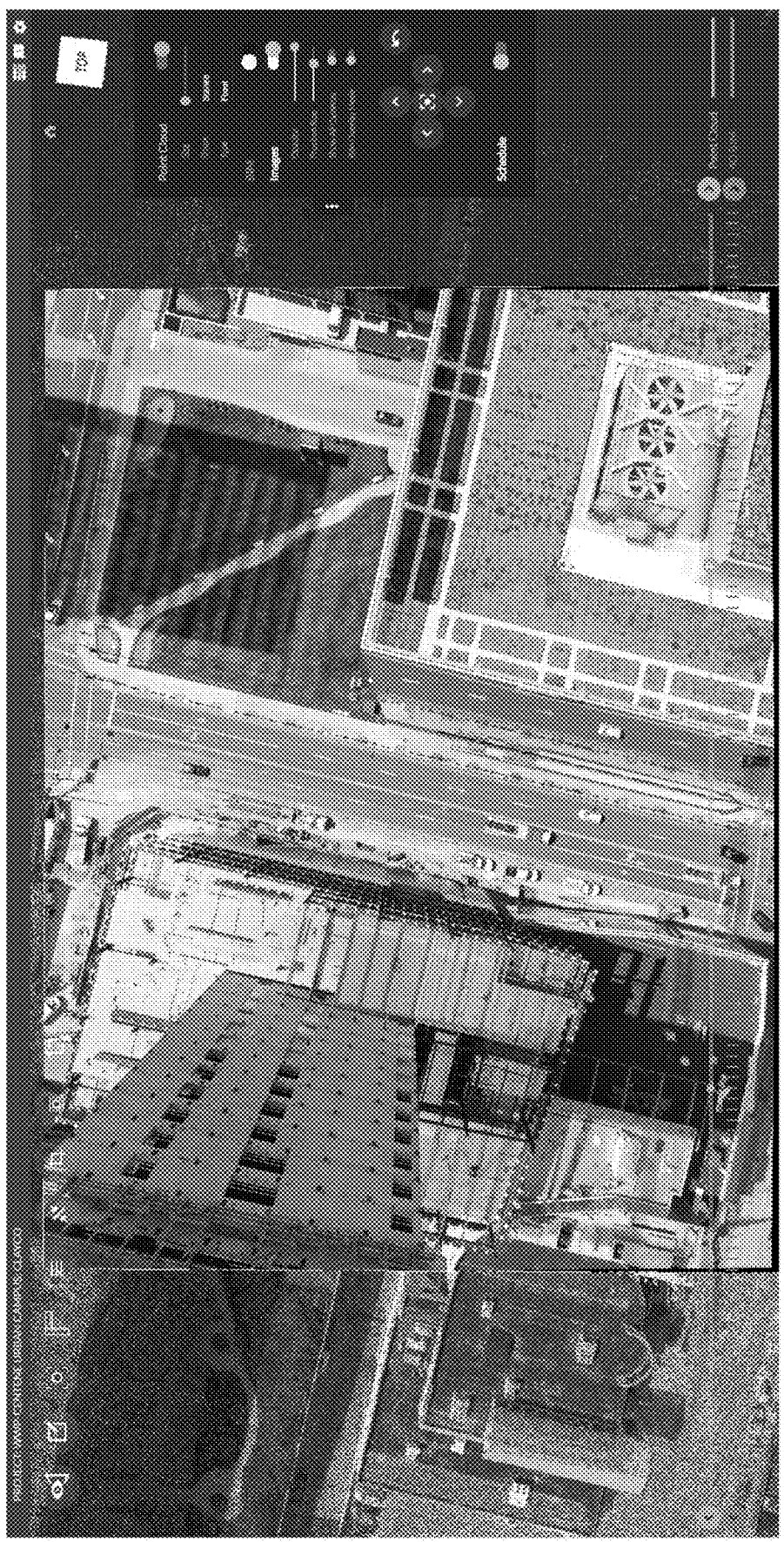
FIG. 9A is an image of a back projection of aerial images (e.g., from a drone camera) onto a point cloud according to an embodiment.
Figure 9B:
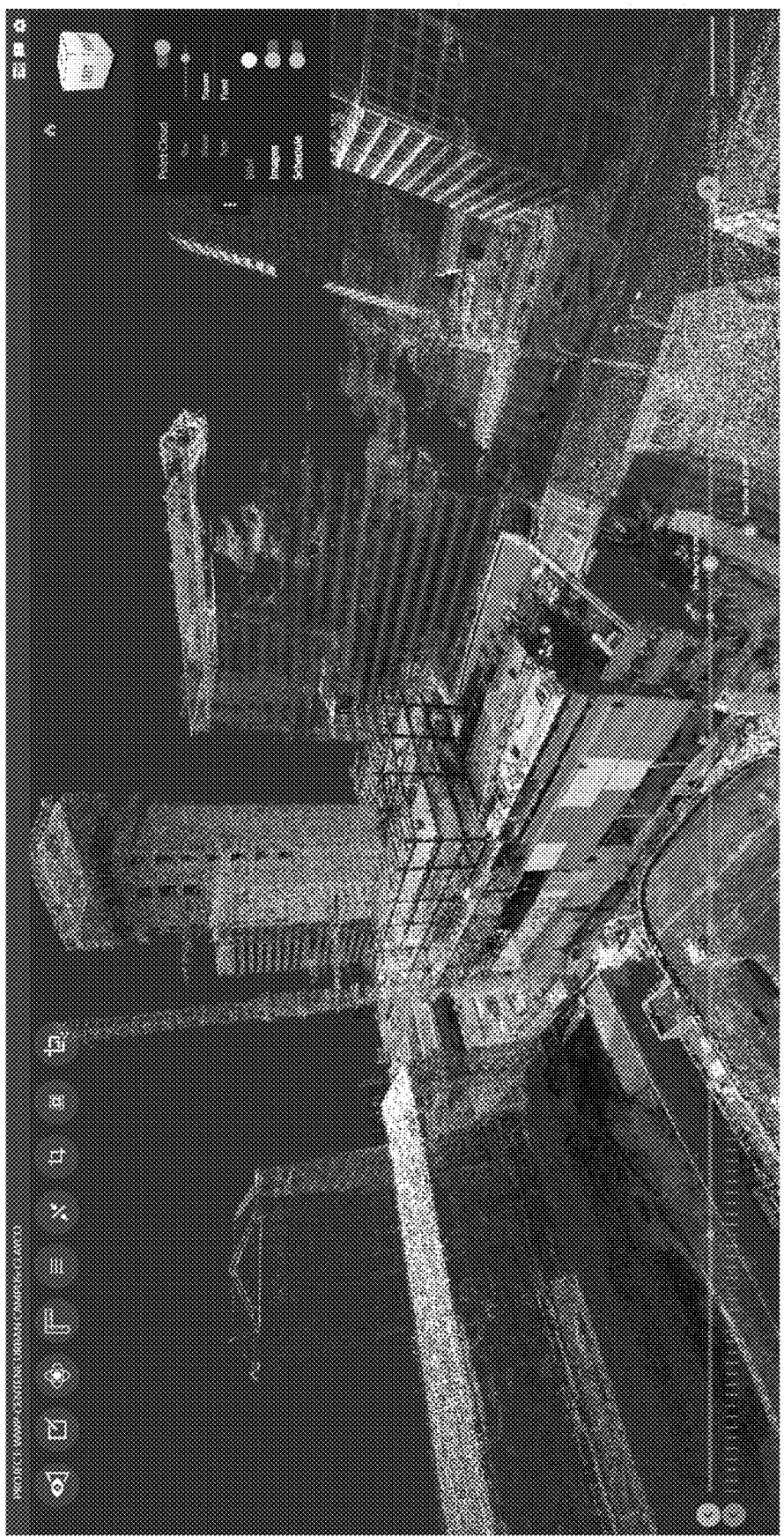
FIG. 9B is an image of point cloud generated for the case study on the McCormick Place Hotel and Stadium project in Chicago, Ill.

The system 100 may provide a user the ability to view the images together with the point cloud from any camera viewpoint, as illustrated in FIGS. 9A and 9B. To do so, the camera calibration information may be derived through the image-based 3D reconstruction procedure discussed earlier and be used to create a frustum in the scene. The frustum may be depicted as a wireframe connecting the corners of the image surface to each other (to form a rectangle) and connecting the corners of the image surface to its camera center. The frustum has the shape a pyramid, with the base representing the bounded image plane and the vertex representing the position of the camera. The base of the frustum is textured mapped with the image that was captured from that camera location. The texture-mapped image surface may be made semi-transparent so that the features of the 3D point cloud and/or BIM are visible together with the features of the overlaid image.

FIGS. 10A through 10C are images illustrating the impact of controlling the level of detail from low detail to high detail within a web-based interface according to various embodiments. FIG. 10D is an image illustrating a point cloud height map according to an embodiment. FIG. 10E is an image illustrating a point cloud in red green blue (RGB), with these colors arranged from top to bottom, according to one embodiment. A number of controls are also introduced for better visualization and manipulation of the point clouds. For example, the user can decide the level of detail, point size, and the opacity of the points to better manage memory limitations on mobile devices such as smartphones or tablets. Increasing the level of detail using the controls on the viewer 232 and its impact on the visualization of the point cloud is shown in FIGS. 10A-10C. Color coding of the point cloud can also be done based on the average color values captured from all images that see the points, or based on a color spectrum to show the relative height, as illustrated in FIGS. 10D and 10E. FIG. 10F illustrates the octree used for pre-processing and query of the points in the cloud.

Figure 11:
FIG. 11 is an image of the web-based interface in which a user may measure the volume in a 3D environment and track the changes from a different time, according to an embodiment.
Figure 12:
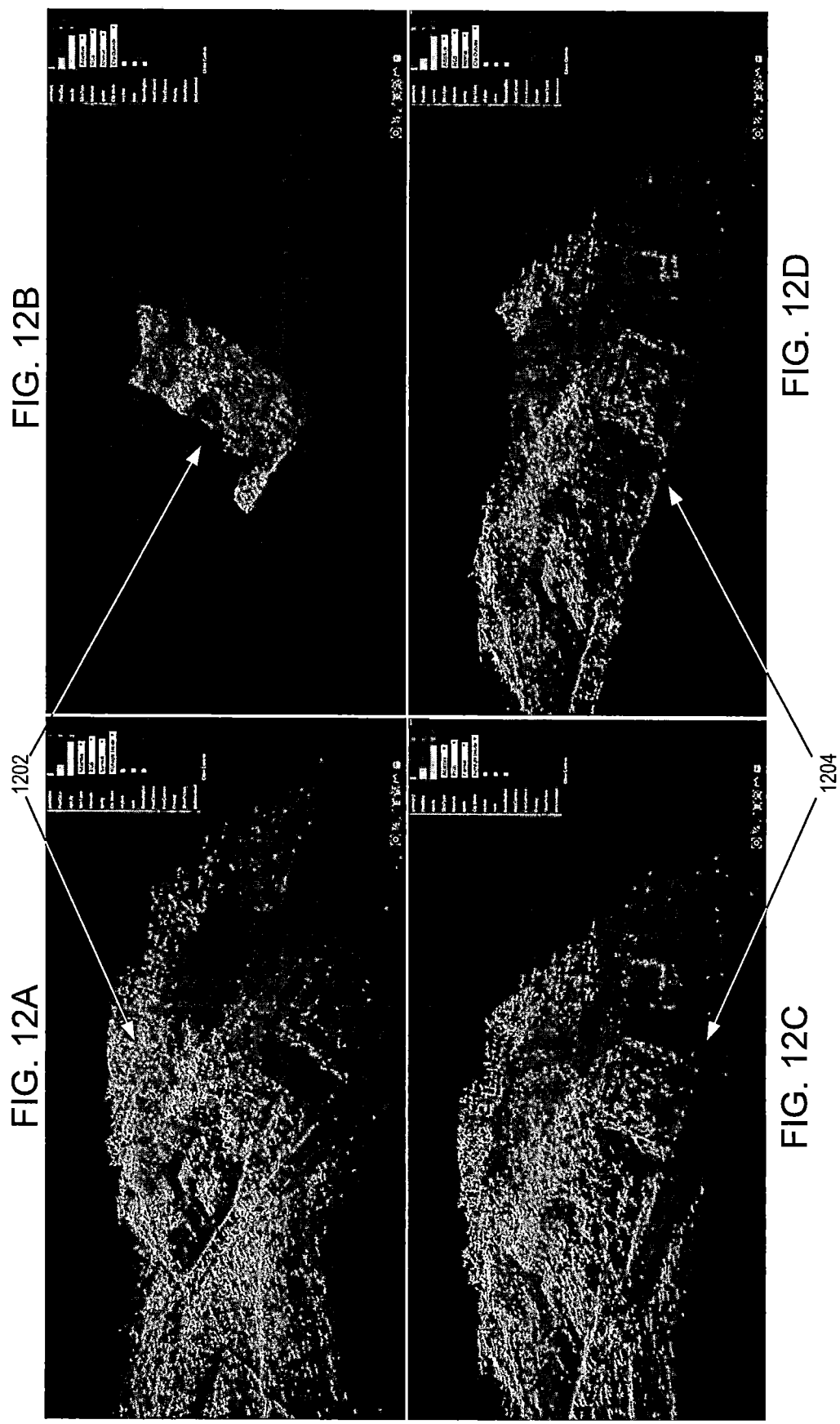
FIGS. 12A through 12D are images within a web-based interface illustrating the segmentation of point clouds for generating cross sections and volumetric measurements of a construction site according to an embodiment.

The viewer 232 may also provide a tool to segment and clip the point cloud for area-based and volumetric measurements, as illustrated in FIG. 11. FIG. 11 is an image of the web-based interface in which a user may measure the volume in a 3D environment and track the changes from a different time, according to an embodiment. The changes in volume may be an indication of construction progress and be provided as a scheduling metric. This allows the user to have a better understanding of the current state of excavation, for example. A clipped region may be set to different width to show the terrain difference and height information, as illustrated in FIGS. 12A-12D, which are images within a web-based interface illustrating the segmentation of point clouds for generating cross sections and volumetric measurements of a construction site according to an embodiment. Note that a first clipped region 1202 in FIG. 12A may be isolated for measurement (FIG. 12B) and that a second clipped region 1204 may also be isolated for measurement (FIG. 12D).

To facilitate management and interaction with BIM, the disclosed system 100 may be built on top of a cloud server for hosting the BIM. In one embodiment, the cloud server may be loaded with Autodesk's Forge, although other web-based platforms are envisioned. The cloud server can support over 60 different types of construction-related file types and translate the files into a feasible format for the web platform. The BIM model that is stored in the cloud may contain the geometry information and the semantic information such as element quantity, element color, element material, and element structural analytics. The geometry and other semantic information may be queried from the cloud-based server for visualization and information-retrieval purposes.

Figure 13:
FIG. 13 is an image of joint modeling and representation of BIM and point clouds within a web-based interface according to an embodiment.

FIG. 13 is an image of joint modeling and representation of BIM and point clouds within a web-based interface according to an embodiment. FIG. 13 illustrates different snapshots of the BIM model hosted on the server that is superimposed with the point cloud. Here, colors may represent the original color of the BIM elements. In one embodiment, a user selection may trigger a query to the server to extract semantic information embedded in BIM elements and which are interrelated. The semantic information used for construction progress monitoring (e.g. expected construction materials and element inter-dependency information) may be queried from BIM and presented through the GUI 138 of the system 100.

Figure 14:
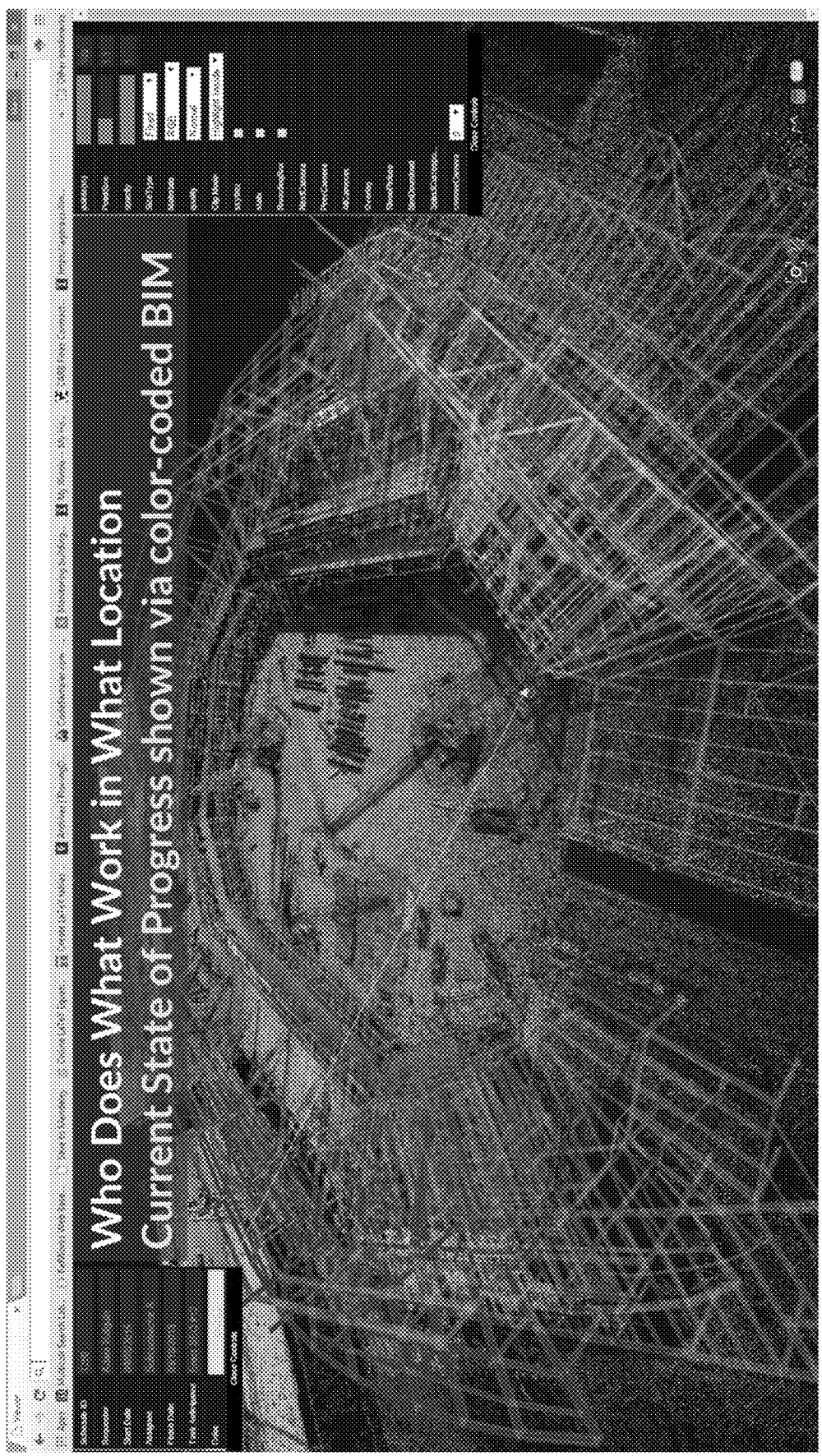
FIG. 14 is an image of the web-based interface in which a user may either annotate point clouds or their corresponding images to create and visualize process information according to project assignment as per an embodiment.
Figure 15:
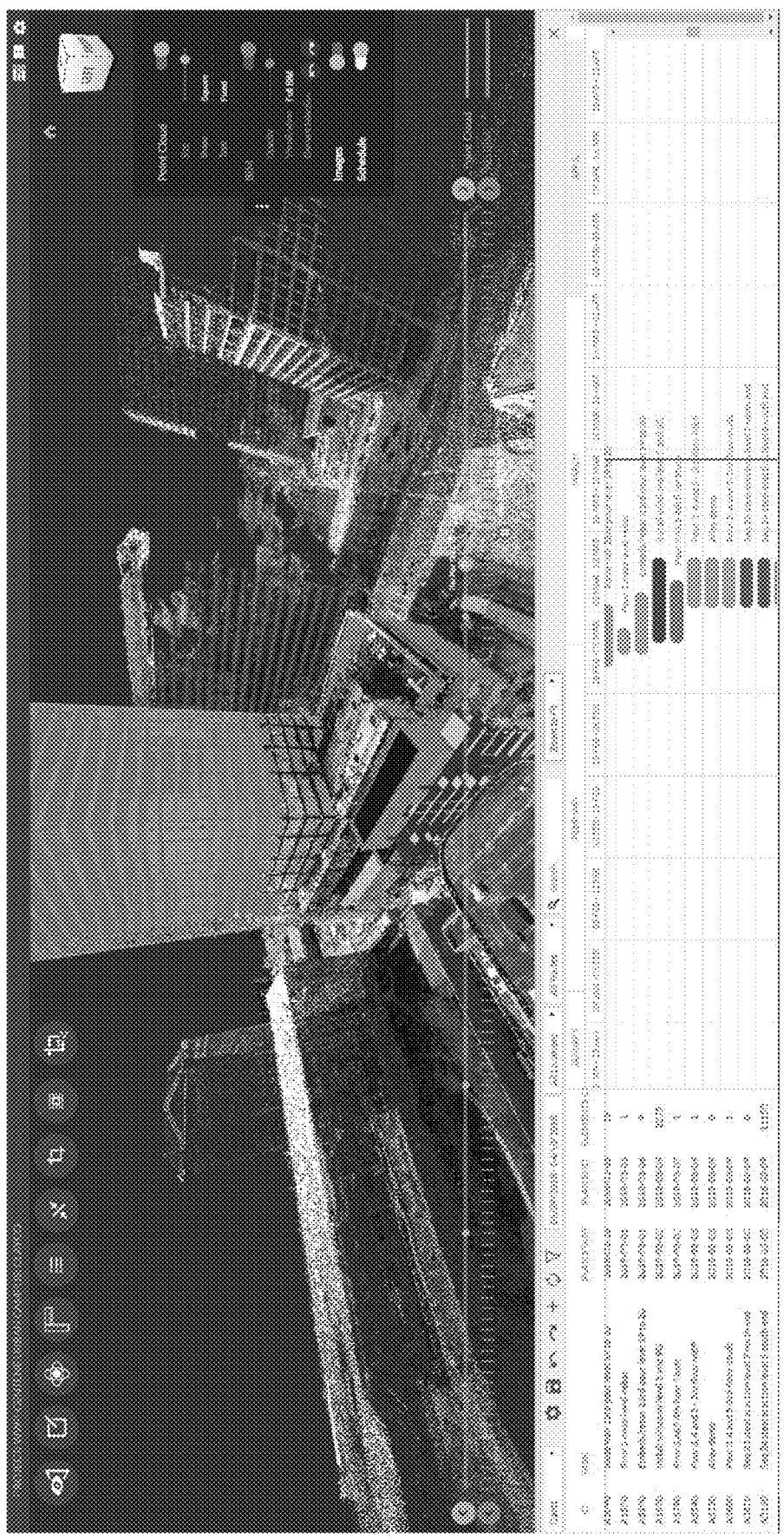
FIG. 15 is an image illustrating, within the web-based interface, four dimensional (4D) simulation of construction activities, which includes a 3D point cloud model and scheduling information, according to an embodiment.

FIG. 14 is an image of the web-based interface in which a user may either annotate point clouds or their corresponding images to create and visualize process information according to project assignment as per an embodiment. FIG. 15 is an image illustrating, within the web-based interface, four dimensional (4D) simulation of construction activities, which includes a 3D point cloud model and scheduling information, according to an embodiment. In various embodiments, the system 100 may also be adapted to capture and document work crew assignments (e.g., who does what in what location) to measure deviations between expected work-in-progress on a construction site (via 4D BIM that includes schedule data) and actual state of work in progress (via point clouds and images).

In some embodiments, before execution of any actual work task on the jobsite, the foreman or the superintendent of the crew—hereinafter "last planner"—logs into the system 100 (e.g., at block 212), chooses the personnel who are going to be specifically focusing on the assigned task from a list, and associates the personnel with a work task and a location (e.g., a group of BIM elements). Then, the system 100 may take the submitted information and assign a color to the location.

As illustrated in FIG. 14, the personnel associated with a construction crew may be highlighted in a particular color on the point cloud (end of arrow) and the relevant information about the work process may be provided in the control box on the top left. The disclosed web-based interfaces allow the teams on a jobsite to login into the system 100 every day, commit their crew to specific locations, track work in progress, and get real-time feedback on locations available for them. This strategy provides actionable information to project management as they can mobilize teams into work areas that can maximize productivity, minimize interferences among teams, and allow the measurement of actual productivity of each team and labor stability index, which will be discussed in more detail below.

This process also streamlines in-process quality inspection. The moment each task is completed, the last planner may log into the system and document the task completion. Task completion information may then be pushed into the system which informs the inspector that a location is ready for inspection. If the inspector needs certain information from the work crew, the system 100 allows the inspector to directly extract that information without the need for additional round of communication with the work crew or other personnel. Once the inspection is complete, the inspector can also use the system 100 for documentation purposes and inform all parties engaged in the task including the work crew or contractor, project management on site, and the owner about the full completion and approval of that task for billing purposes.

In various embodiments, disclosed processing logic may display, in the GUI, scheduling data associated with the 4D BIM within at least one of a bar chart, a spreadsheet, or a calendar. The processing logic may further detect, through the GUI, a user selection of a unit of measure for benchmarking and tracking progress associated with a work task. The processing logic may further, in response to detection of the user selection, query one or more databases for quantities associated with the query, and return the quantities and optionally other data pertaining in response to the query.

Predictive Visual Data Analytics

In this section, described is a method to compute a set of task readiness metrics such as "task readiness index," "task readiness reliability index," and "location risk index" that together measure potential performance problems at the scheduled-task and work-location levels, using actual progress deviations in both preceding construction tasks and their logistical and contractual constraints.

To better identify productivity barriers for control decision making, disclosed methods facilitate mapping and visualizing the location and activity of construction crews in addition to observed physical changes to the scene of a construction site and proposed alternatives in a web-based environment where point cloud and BIM may be jointly visualized. Within this environment, progress deviations and risk for potential delays may be color-coded over the 3D BIM using metaphors such as traffic light colors. Polygon representations may be used to locate work crews in an interactive 3D viewer to provide an intuitive assessment of current state of progress, their activities, or the risk associated with potential schedule delays.

Using the system 100 during weekly work plan meetings, project teams can compare 4D as-built and plan models, tracking work crew assignments via a color-coded model, update the 4D model in real time, document manpower per task per location, and enable documentation of root-causes for delays and task constraints. Note the metrics Readiness Index (RI) and Readiness Reliability (RR), which are described in more detail below, may be employed for measuring reliability of schedule tasks in the current weekly work plans and look-ahead schedules based on the status of predecessor tasks (tasks that must be finished before the next task can start) and task constraints. The metric Location Risk Index (LRI) may be built on top of RI and RR to facilitate location-based reporting of risk for delays and proactively support schedule coordination.

The status of the predecessor tasks and unresolved task constraints may prevent upcoming tasks from starting on time or require more resources to keep the progress on track. To mitigate the risk of delay, RI and RR metrics may provide the construction team the opportunity to examine the readiness of the upcoming tasks, and the tasks enable them to proactively monitor the project progress. The construction team may then have a better understanding of which tasks can start on time and which ones require revisions in the upcoming coordination meetings. Instead of retroactive metrics, such as Percent Plan Complete (PPC) or Earned Value Analysis (EVA) metrics such as Schedule Performance Index (SPI) and Cost Performance Index (CPI), RI and RR may proactively adjust the flow of people, material, work, and information according to schedule. To predict the readiness of an upcoming task, the system 100 may acquire statuses of the predecessor tasks and task constraints, the expected status of the task at the time of calculation, and the reliability of the task's on-time completion.

The Readiness Index (RI) measures the readiness of the task to be executed, which depends on whether all predecessors and task constraints are completed or released. RI may receive, as an input, a measure of "Percent Complete" (PC) for each predecessor task and task constraint. Percent Complete may be defined as the percent of physical progress towards completion of the task or the task constraint. Task constraints may be organized as approvals, information, labor, equipment, prerequisite work, directives, spaces, and safety. The Percent Complete of tasks and task constraints may be reported by engineers or subcontractors in the field, or by comparing Reality models (3D point clouds and 2D images) with the 4D BIM (model and schedule). The following process is recommended to objectively measure Percent Complete for a task. First, identify the unit of measure for tracking task progress. Examples of units of measure include cubic yard (C.Y.) for concrete placement, linear foot (L.F.) for drywall installation, and square foot contact area (S.F.C.A) for formwork. A total quantity of work for the task may be computed by conducting quantity takeoff among associated elements in the 4D BIM, e.g., 100 cubic yards of concrete. Percentage Complete per scheduled task may be calculated as the actual physical progress, ideally computed based on the completed elements and unit of measure, divided by the total quantity of work.

Onsite project engineers and subcontractors (e.g., work crews) may also provide direct input for the Percent Complete of task and task constraints. Other sources such as daily construction reports, photo logs, billing documentation, and the like provide equivalent information when the previous two are not available. The summation of all the Percent Completes with a function of weight contribute to RI as in Equation 1.

$$RI_i = \Sigma_j \varphi_j \cdot PC_j; \Sigma_j \varphi_j = 1 \quad (1)$$

In Equation 1, $\varphi_j \varphi_j$ is a weight determined by the importance of the predecessor tasks and the task constraints. The weight may be defined from the project engineers' experience, or a function of the total float from the master schedule as Equation 2.

$$\varphi_j = \frac{e^{-TF_j}}{\sum_j e^{-TF_j}} \quad (2)$$

For example, to be able to start the task "Level 5 Area C Concrete Wall Placement," the following tasks may need to be completed: Level 5 Area C Wall Rebar with PC=0.8 and the Request for Information (RFI) of the concrete subcontractor with PC=0.3. While the project engineers think the predecessor task "Level 5 Area C Wall Rebar" may be more important than the RFI, the project engineers may assign 0.6 for the task and 0.4 for the RFI. The weights may sum to one. Then the RI of task "Level 5 Area C Concrete Wall Placement" may be calculated as 0.6*0.8+0.4*0.3=0.6. This means the task is about 60% mature to start on time.

The weights may also be determined based on the total float (TF) as in Equation 2. Total float is a basic metric from the Critical Path Method (CPM) and is defined as the difference between the early start date and the late start date of the current task. Total Float indicates how much buffer a task may have before the task delays the whole schedule. The smaller the total float, the more critical the task. When the total float is zero ("0"), the task is on the critical path and cannot be delayed without impacting the entire project schedule and its project completion date. Although tasks from the Weekly Work Plan (WWP) may not be extracted from the master schedule, the tasks may be mapped to tasks from the master schedule to get the total float. Further to the above example, assume the TF of "Level 5 Area C Wall Rebar" is zero and the TF of RFI is two, resulting in the $\varphi$ $\varphi$ for each of them as 0.88 and 0.12, respectively. Furthermore, the RI each may be determined as 0.88*0.8+0.12*0.3=0.74.

The Readiness Reliability (RR) metric may be calculated as a composite of the current status RI and the reliability of the work crew to finish the remaining task according to Equation 3.

$$RR_i = RI_i + \Sigma_i \varphi_i \cdot (1-PC_j) \cdot \Omega_{mj} \quad (3)$$

In Equation 3, $\Omega_{mj}$ presents the probability of work crew (m) finishing the remaining task (j), and $PC_j$ is the Percent Complete on task j. The system 100 may compute a goodness of fit to determine the best statistical distribution (e.g., Poisson, Exponential, Weibull, Johnson, or the like) to estimate the expected duration via prior tasks executed by the same work crews. Specifically, past productivity of the same work crews may be recorded, and then the data used to fit into statistical models, where the system 100 may also determine which model enables the best fit to past data. The productivity is calculated by dividing the quantities according to man hours. The quantities may be automatically extracted from the production level 4D BIM, and the man hours may be input by an on-site project engineer, for example. A productivity data example of one steel subcontractor performing steel erection is shown in Table 1.

TABLE 1

| | Week 1 | Productivity (lbs/mhr) |
|---|---|---|
| Steel Seq. 1 | 18 April | 712.18 |
| | 19 April | 302.23 |
| | 20 April | 1046.38 |
| | 21 April | 321.27 |
| | 22 April | 546.82 |
| | 23 April | — |
| Steel Seq. 2 | 24 April | — |

From the example above, steel sequence 1 has a total duration of 6 days with one day left. The total quantity of the task is 242,000 lbs. On 23 April, 50,000 lbs steel is planned to be erected with 80 expected man hours. Steel sequence 2 is the successor, and we want to calculate its RR. Based on the quantities, it is known that 80% of work is done, and with only one predecessor the RI is 0.8. By plugging the expected productivity (625 lbs/mhr) into a statistics model that is generated from the past data as shown in the example, the system 100 may result in a probability of 46.5% to finish the task on 23 April. The RR of this task may then be calculated as 0.8+0.2*0.465=0.893. The best statistical model for representing $\Omega_{nj}$ may be chosen by employing a goodness-of-fit test or by inspecting, within plots of the probability density function (PDF), cumulative distribution function (CDF), quantiles, and survivor function. In various embodiments, the system 100 may process the following statistical models: Johnson distribution, exponential distribution, Poisson distribution, and Weibull Distribution, among others.

Location Risk Index (LRI) is a metric for directly communicating risk for potential delays per work location to the construction teams. The direct use of PC, RI, or RR metrics for communicating progress deviations and readiness to initiate a task on time as scheduled may focus attention on just one group and, therefore, negatively impact the spirit of collaborative partnership in contractor coordination meetings. To improve collaboration and support proactive management of the project schedule, the system 100 may measure stability of workflow at a given location (location risk index) based on readiness reliability of all schedule tasks planned to be executed in that work location. LRI may be redefined as expressed in Equation 4, e.g., as a metric to measure the reliability based on locations assuming all tasks and constraints (j) are not independent but are mutually exclusive.

$$LRI_i = \Pi RR_j \quad (4)$$

Based on the calculated indexes, the system 100 may highlight on the 4D BIM, through the user interface, top at-risk locations to communicate the most important work locations and their corresponding schedule tasks that need attention in coordination meetings and also support collaborative planning, one of the pillars of lean construction. By providing these visual 3D production maps color coded with top at-risk locations, the project management team is able to prioritize how to address problems associated with schedule performance and risk for delays based on their impact on the construction plan and bring transparency to the ongoing workflows.

Predictive Analytics Reporting

Visual production control reports: Based on predictive visual data analytics, a method is developed to produce novel "visual production control" reports including "reports that highlight actual progress deviations," "productivity reports," "master plan versus WWP report" and "top at-risk locations" on a construction project. These reports contain both visual and non-visual analytics and provide insight on "reliability" of weekly work plans and look-ahead schedules on construction projects.

Progress Reports are organized around locations within work breakdown structure (WBS) and may be offered to project teams on a weekly basis or on a daily basis. The data is usually compiled one day prior to weekly contractor coordination meetings to provide project teams with the most up-to-date state of work-in-progress for their coordination purposes. These reports can be customized to include status of work-in-progress on the prior week's activities. They can also be integrated with the look-ahead schedules to provide an outlook to the tasks that are planned to be executed within the next three, four, or six weeks.

The progress reports empower project teams to conduct root-cause analysis on schedule performance, re-organize their weekly work plan and look-ahead schedule around WBS locations, and analyze the impact of risk for delays and plan changes on the overall project schedule and cost. The metrics that are used in the progress report are listed as below in Table 2.

TABLE 2

| Metric | Definition |
|---|---|
| Percent Complete (PC): | The percent complete of physical progress per scheduled task. |
| Percent Plan Complete (PPC) | Measure of how well the project plan is being executed. May be calculated as the number of tasks completed on the day stated divided by the total number of tasks planned for the week, which measures the percentage of tasks 100% complete as planned. |
| No. of Tasks Delayed | Number of scheduled tasks delayed from the prior week. |
| No. of Tasks Repeated | Number of tasks scheduled to start in a week, but their start dates are pushed to the subsequent week due to delays in their preceding tasks or their task constraints not being met. |
| Tasks Not Anticipated | In the event a new task is added to the weekly work plan that was not initially scheduled, the new task will be flagged as "task NOT anticipated." |
| Task Repeated | Tasks flagged under this column when their start date is pushed to the subsequent week due to delays in their preceding tasks or their task constraints not being met. |
| Root Cause Delay | This column in progress reports offers an opportunity for project teams to document root-causes of task delays in their weekly coordination meetings. The recommended list of delay root-causes includes, for example: RFI not Answered, Information Not Available, Submittal Not Approved, Staff Not Available, Labor Not Available, Materials Not Available, Equipment Not Available, Poor Task Description, Prior Work Not Complete, Under-Estimated Effort, Task Sequence Change, Change in Work Plan, Contracts/Revisions, Conditions Unsatisfactory, Off Project Demands, Weather Conditions, Design Change. |

Figure 16A:
FIG. 16A is a set of graphs that make up a progress report illustrating a performance overview of a construction project, including root causes for six-week delay, according to an embodiment.
Figure 16B:
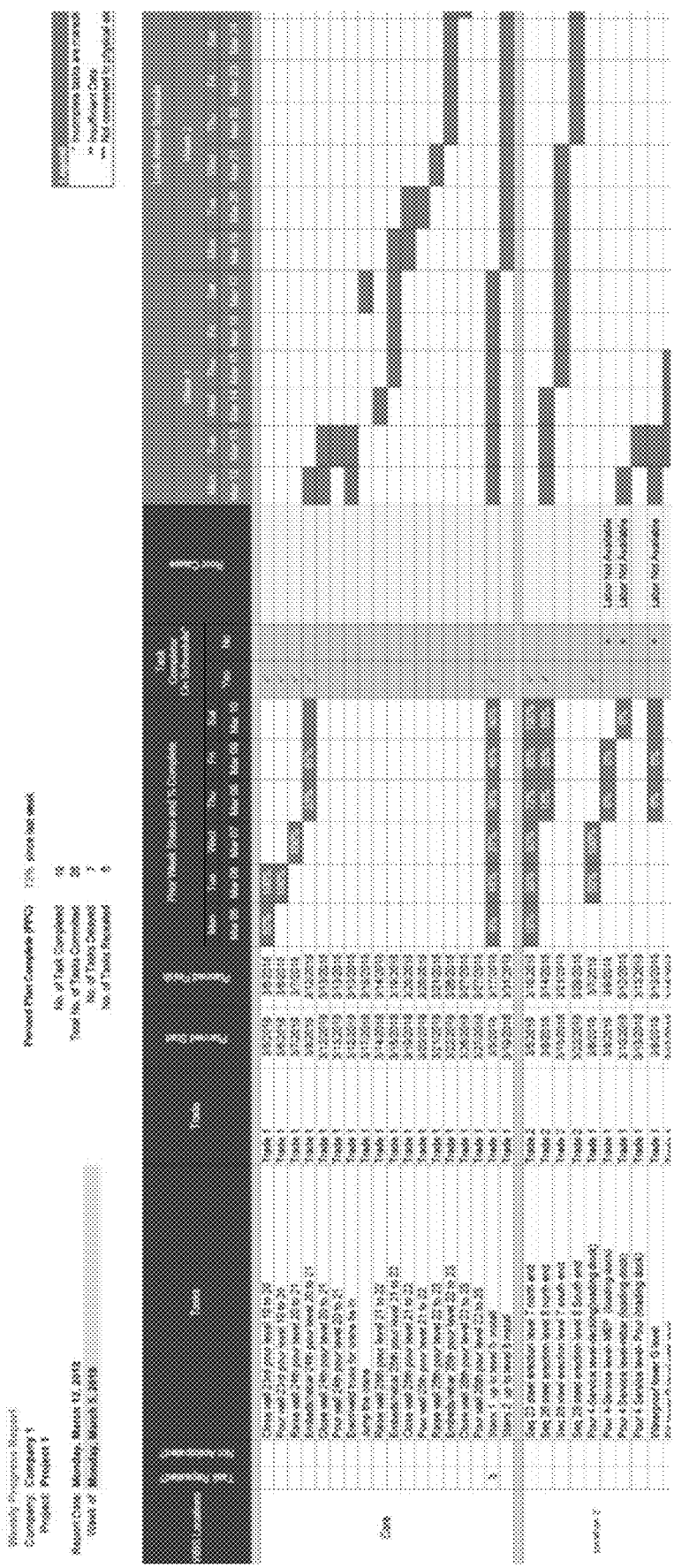
FIG. 16B is a graph illustrating a weekly work plan (WWP) and a look-ahead plan organized in work breakdown structure on which point clouds are recorded, as per various embodiments.

FIG. 16A is a set of graphs that make up a progress report illustrating a performance overview of a construction project, including root causes for six-week delay, according to an embodiment. FIG. 16B is a graph illustrating a weekly work plan (WWP) and a look-ahead plan organized in work breakdown structure on which point clouds are recorded, as per various embodiments. The overall project performance for the past week and over six weeks is shown to help project managers easily understand the status and problems of the project. A Weekly Percent Plan Complete (PPC) and PPC summary provide an overview of how well the project plan is executed over the past six weeks. The schedule task volume indicates how many tasks are committed by the subcontractors and if the tasks are executed as planned. The prior week's PPC snapshots may provide performance broken down per subcontractors. The list of six-week delay root causes offers the project team the ability to quickly understand, communicate and analyze the root causes of delays and make plans to avoid them.

Figure 17B:
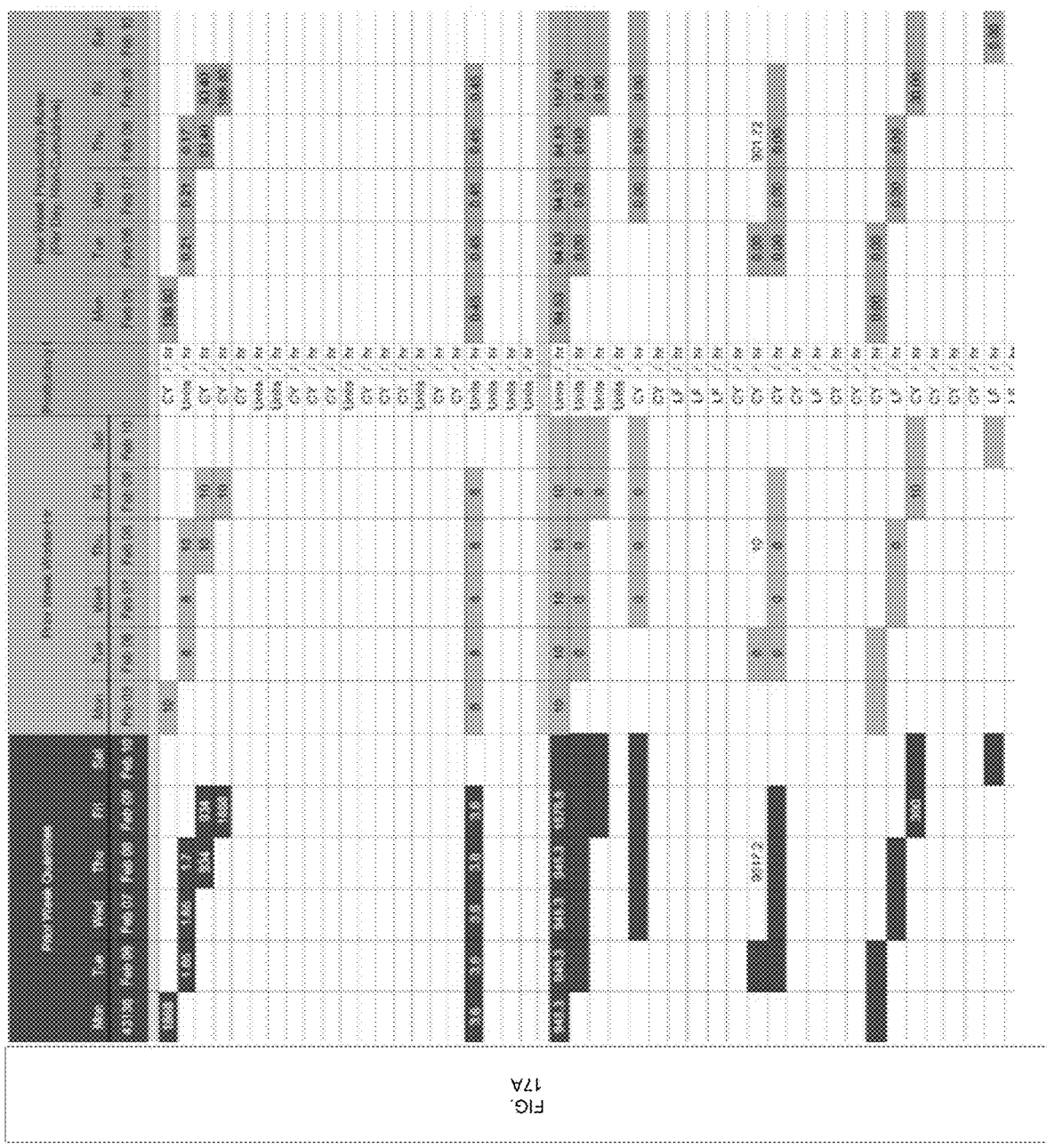
FIG. 17B is a graph illustrating the productivity report of FIG. 17A and further, from left to right, prior week quantities, prior week worker hours, and prior week productivity rates, according to various embodiments.

FIG. 17A is a graph illustrating a productivity report with prior week point clouds, according to an embodiment. FIG. 17B is a graph illustrating the productivity report of FIG. 17A and further, from left to right, prior week quantities, prior week worker hours, and prior week productivity rates, according to various embodiments. The graphs of FIGS. 17A and 17B may be generated as a single report. Productivity reports offer detailed information of physical progress on construction sites that can be presented in various forms including percent plan complete per trade or per work package. Provided with the daily total number of man-hours committed to each task in the scheduling interface, e.g., the schedule interface 236 of the UI front end 200, the reports can be presented at the trade or work package levels.

Manpower and actual productivity rates are measured at the trade and work package levels. These reports empower project teams to stabilize personnel planning across their work locations and offer them actionable information that can improve reliability of their look-ahead schedules. The productivity reports may include a Productivity Rate metric, which may be physical progress, in form of units of completed work, per worker-hour; e.g., for concrete placement: C.Y./worker-hour, or concrete formwork: S.F.C.A./worker-hour, where S.F.C.A stands for square footage of contact area). These productivity rates may be presented at the specific trade or work package level.

Figure 18A:
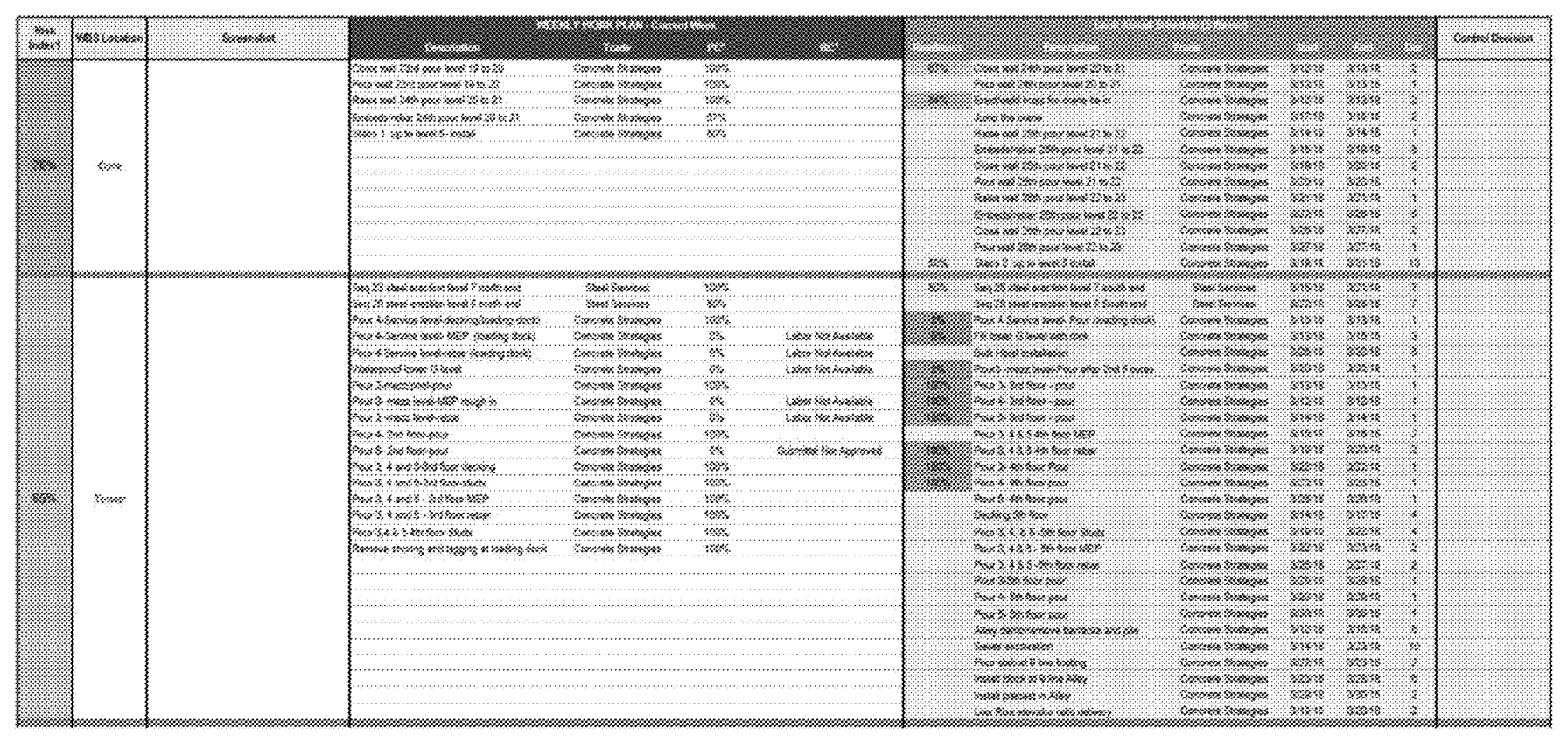
Figure 18B:
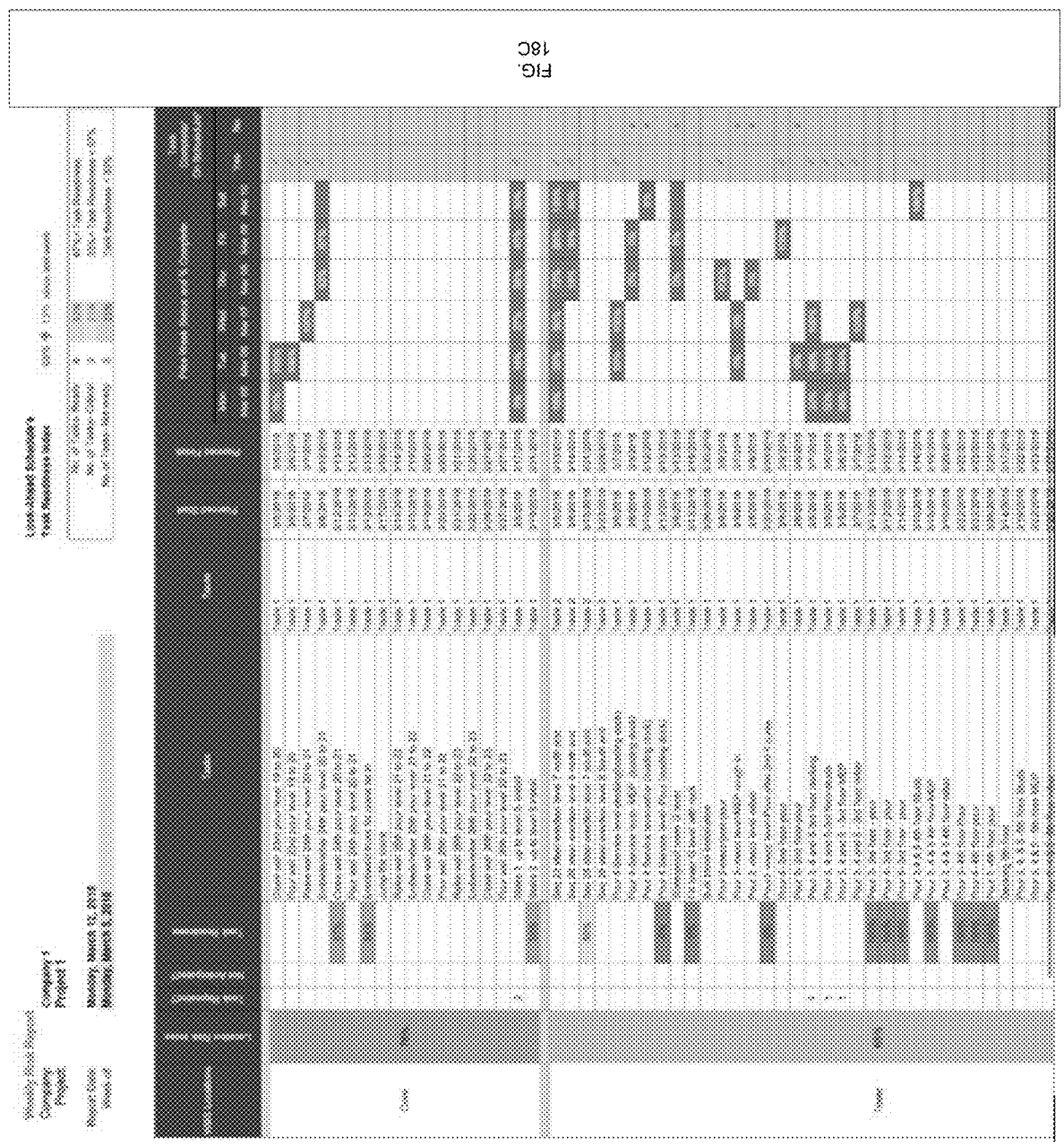
FIGS. 18B and 18C are a graph illustrating tasks organized similar to a progress report, with additional task readiness columns, according to an embodiment.
Figure 18C:
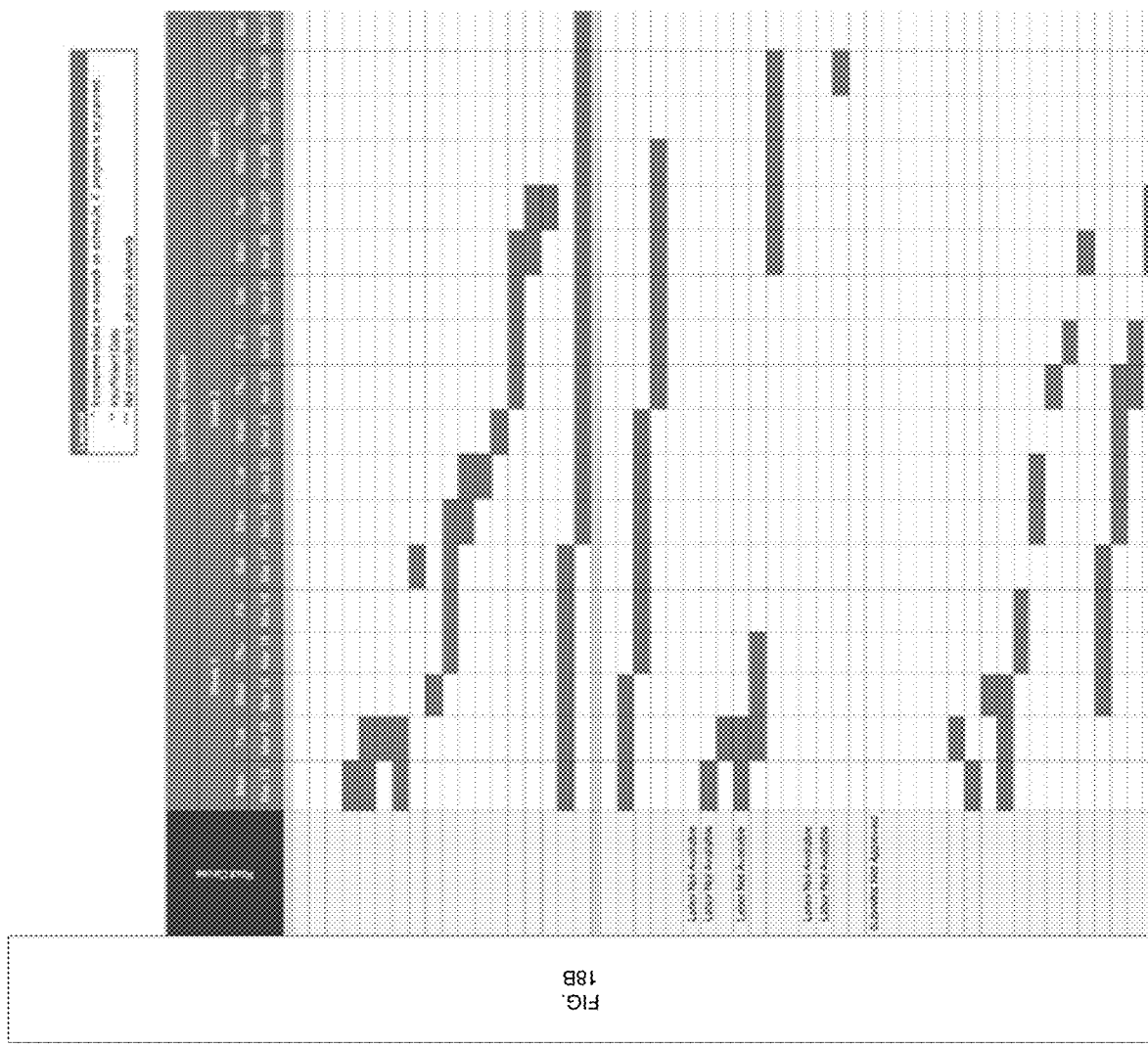

FIG. 18A is a graph illustrating an at-risk location report organized by locations within the work break down structure of the schedule, WWP, and look-ahead schedule, according to an embodiment. FIGS. 18B and 18C are a graph illustrating tasks organized similar to a progress report, with additional task readiness columns, according to an embodiment. At Risk Location Reports may be organized around work breakdown structure (WBS) locations, which highlight and communicate potential delays in the project look ahead schedule (e.g., three, four, or six week look-ahead schedules). These reports inform project teams about potential delays in upcoming tasks on a timely basis and empower the teams to revise the look-ahead schedule, document task constraints, get buy-in from the project teams on the look-ahead schedule, and tap off these potential schedule delays before they surface on their job sites.

Figure 19:
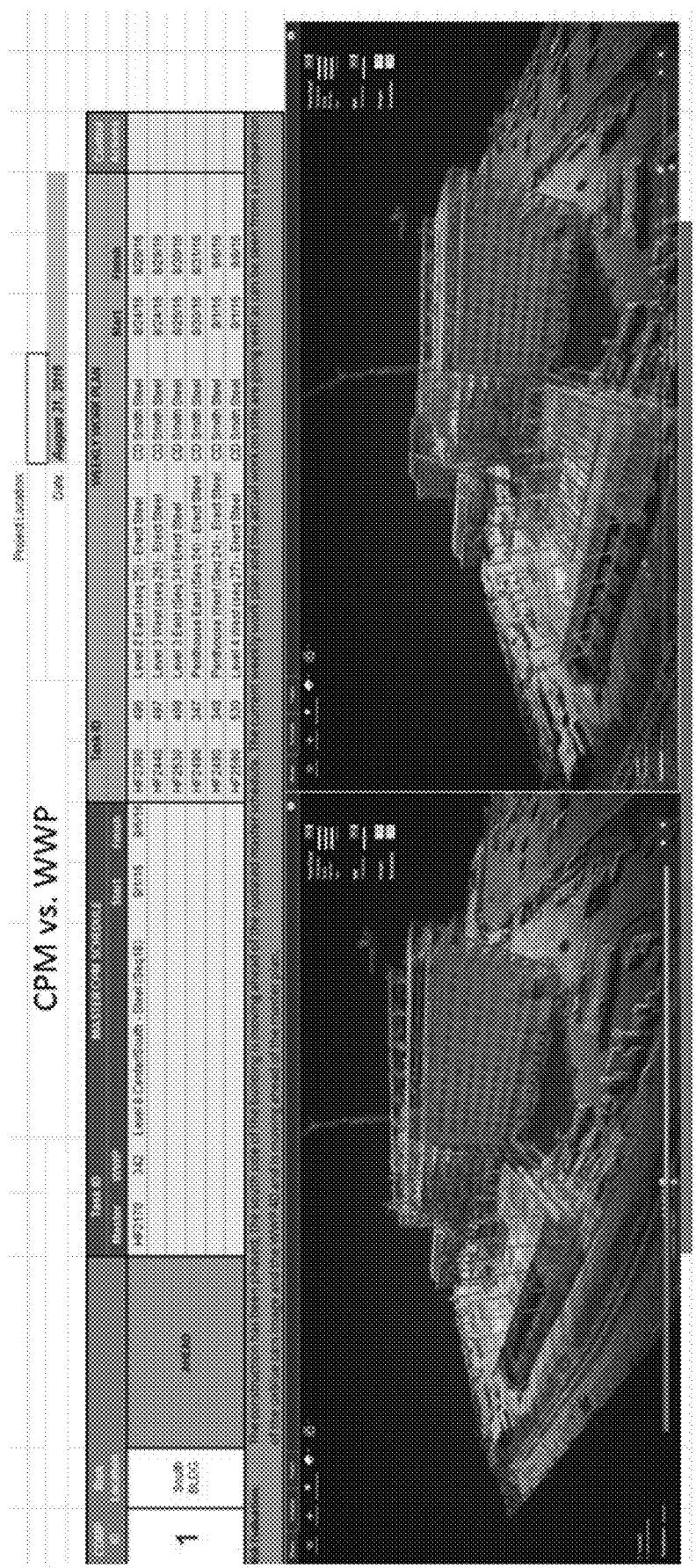
FIG. 19 is an image of the web-based interface illustrating a master schedule versus a weekly work plan that includes risk reporting, according to an embodiment.

FIG. 19 is an image of the web-based interface illustrating a master schedule versus a weekly work plan (WWP) that includes risk reporting, according to an embodiment. This report may highlight risk between 4D BIM that ties in tasks at the weekly work plans with BIM elements, and the 4D BIM that ties in tasks at the master schedule with BIM elements. On a weekly basis, these reports may visually highlight those BIM elements that their execution varies between 4D BIM that ties in tasks at the weekly work plans with BIM elements, and the 4D BIM that ties in tasks at the master schedule with BIM elements.

These master schedule-versus-weekly-work plan-risk reports may be brought into pull planning meetings, contractor (e.g., work crew) coordination meetings, or can be directly used for reporting schedule performance to owners. The application of these reports may help bring immediate attention to the risk between how a project is being managed at the jobsite level and how progress was initially planned and communicated with the owner, and in turn may minimize time necessary for updating progress in a project's master schedule.

Model Color Coding

Visualization of the disclosed models aids to effectively communicate the project performance. To improve the planning process and avoid constructability issues, system 100 may employ different visualization modes with different color coding on the disclosed models to clarify and set out the construction schedule, communicate the work crew location, state of progress, and at-risk locations. The system 100 may integrate the color-coded model with the reality point cloud models to more effectively communicate deviation between the as-built and as-planned models. A visualization mode may be built using 4D visualization (3D model+time) models including 3D point cloud models and/or a 4D BIM. The 4D BIM may include a 3D BIM that reflects which elements are to be constructed by a given date according to a construction schedule. As the user sets different dates, the 3D point cloud models and/or 4D BIM illustrate the corresponding progress on different sections in ways that will be explained in detail.

In various embodiments, the processing logic retrieves the 4D BIM of the construction site from memory (or from a location elsewhere across a network). The processing logic may further align the 4D BIM to one or more 3D point cloud models, and display the 4D BIM, as aligned, superimposed on the one or more 3D point cloud models to illustrate as-built construction progress compared to the construction schedule. After this alignment is performed, the one or more 3D point cloud models may be selectively removed to focus in on the 4D BIM and associated color coding as will be explained in more detail. At any time, however, a user may reselect the point clouds (as seen in the legends of many of the following Figures) to see what updated 3D point clouds indicate to be as-built progress.

Figure 20:
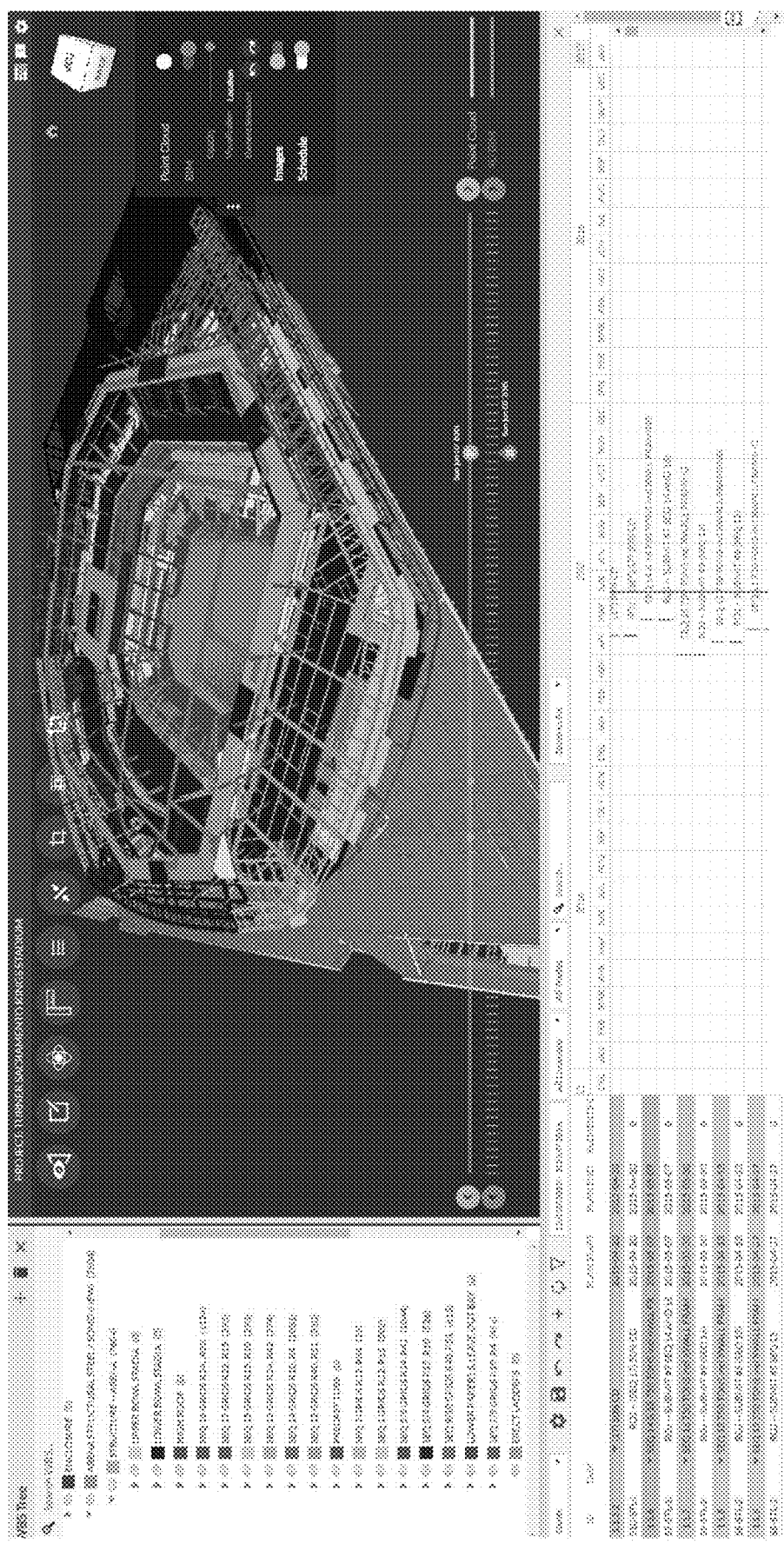
FIG. 20 is an image of a location visualization mode in which elements are grouped based on work breakdown structure (WBS), according to an embodiment.

FIG. 20 is an image of a location visualization mode in which elements are grouped based on work breakdown schedule (WBS), according to an embodiment. A location mode as illustrated in FIG. 20 offers a color-coded model based on the WBS (work breakdown structure) locations. Colors may be automatically assigned or picked for each location under the WBS. The color-coded model helps the user easily understand what tasks are grouped into a WBS location, extract the quantities of their corresponding BIM elements, and communicate the schedule and logistics among different activities. The hierarchical WBS tree menu on left of FIG. 20 may have squares that are color coded in a way that matches coloring on the BIM elements of the construction site.

In one embodiment, processing logic may retrieve a WBS set of data that categorizes sections of the elements of the 4D BIM according to WBS locations each of which is assignable to a different work crew. The processing logic may further display, in the GUI, the 4D BIM with color-coded sections of the elements according to respective WBS locations and display, in the GUI, a list of the WBS locations written in text and that includes a color legend corresponding to the color-coded sections.

Figure 21:
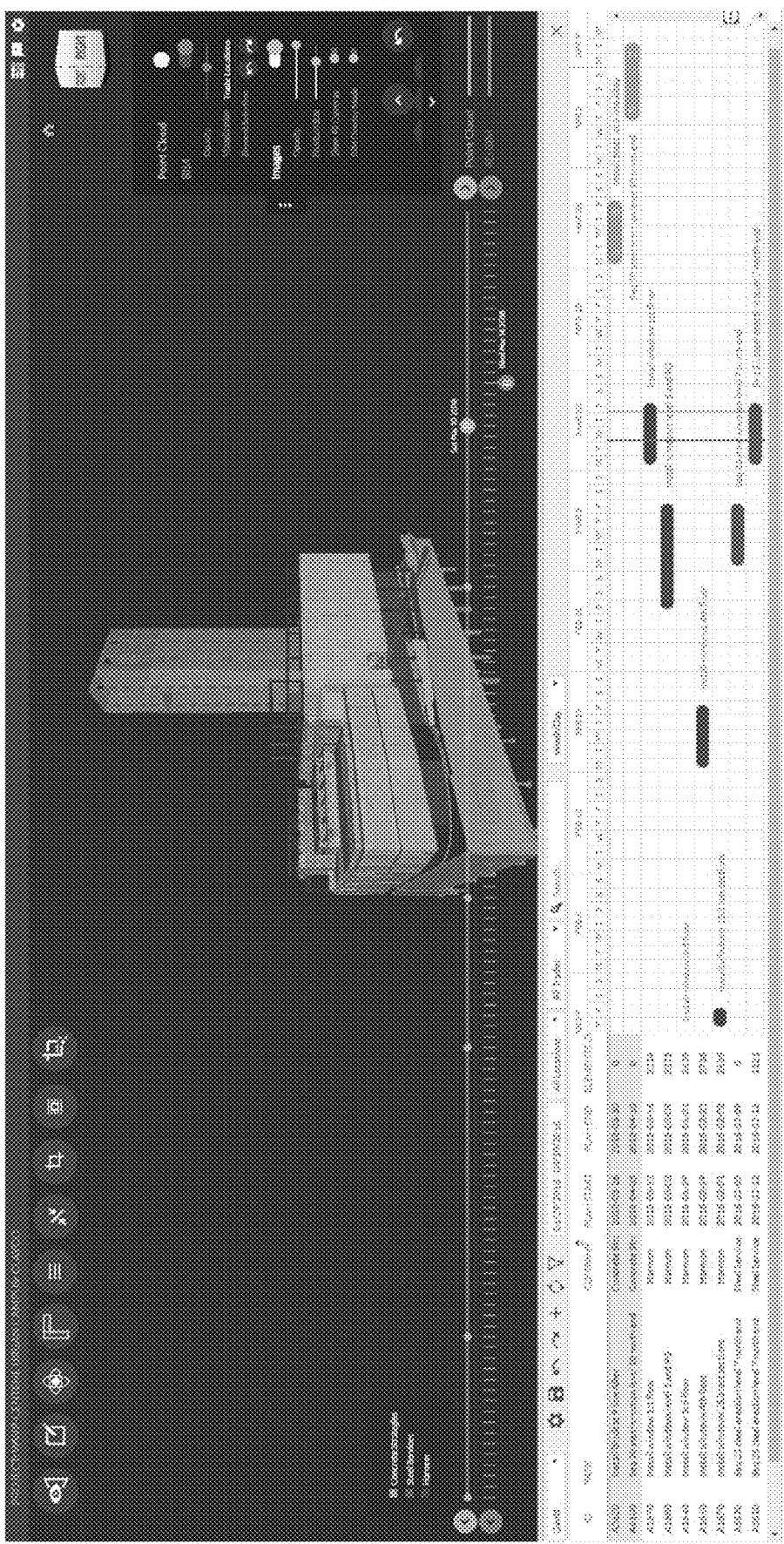
FIG. 21 is an image of a trade location mode within the web-based interface in which a trade location mode illustrates project assignment.

FIG. 21 is an image of a trade location mode within the web-based interface in which a trade location mode illustrates project assignment. The trade location mode may facilitate users to easily communicate work crew assignments to particular locations of the construction site. The trade location mode may be used during the coordination meeting and foremen meeting to clarify the plan daily and weekly. This trade location mode can also be used to communicate which crew is conducting what task at what locations, what work locations are occupied and not available. This mode is also helpful in analyzing space utilization and crew mobilization to avoid site congestion.

In various embodiments, the processing logic may color code sections of elements of the 4D BIM according to work crew assignment, to generate color-coded sections viewable on the 4D BIM. The processing logic may display, in the GUI, a legend indicative of which work crew is handling which color-coded section according to color code. The processing logic may further display, in the GUI, a list of activities performed by respective work crews in a form of one or more of a bar chart, a spreadsheet, or a calendar, wherein the activities are color-coded the same as are the respective work crews in the 4D BIM and the legend.

Figure 22:
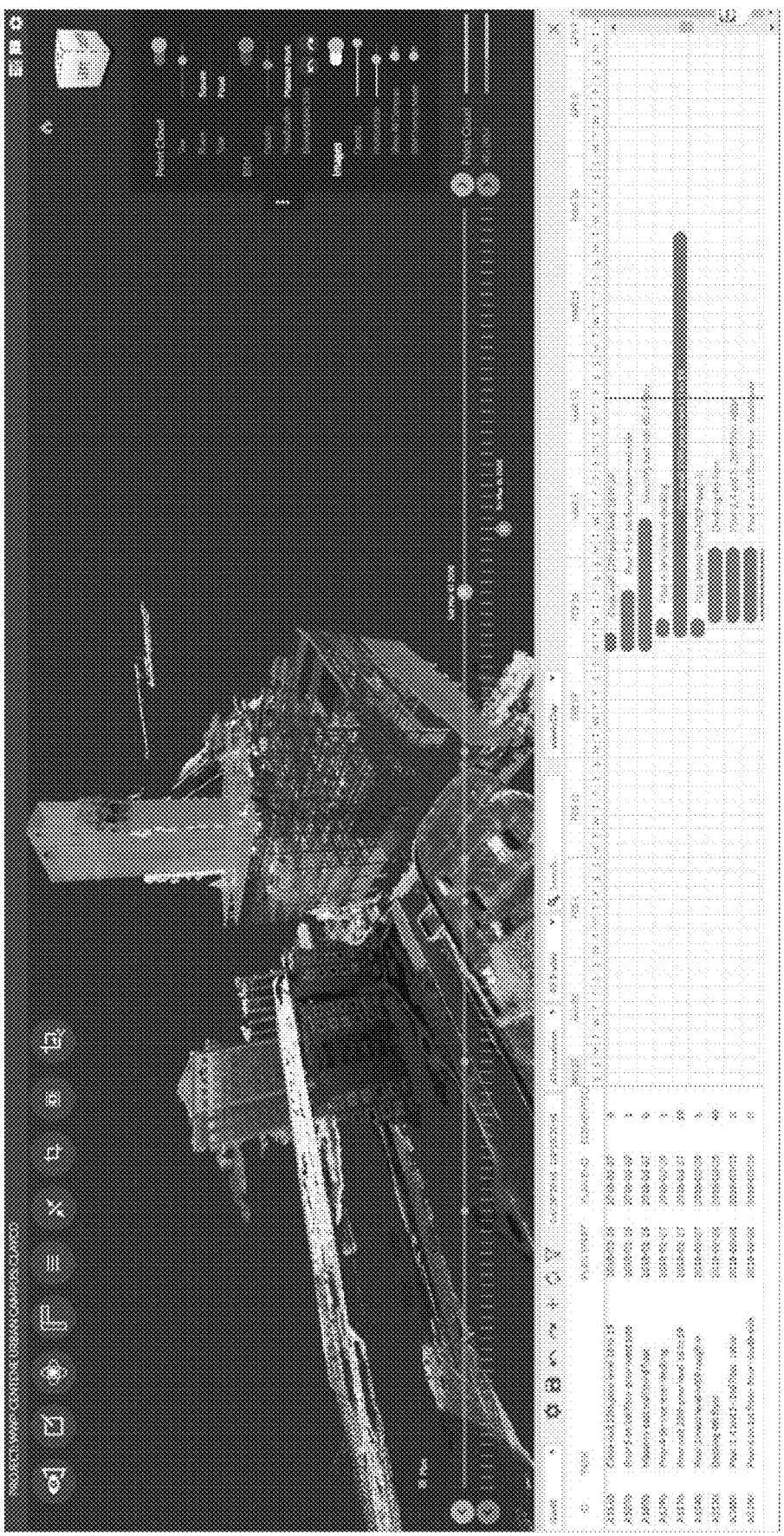
FIG. 22 is an image of a planned mode within the web-based interface that illustrates a 4D BIM that also reflects project schedule, according to an embodiment.

FIG. 22 is an image of a planned mode within the web-based interface that illustrates a 4D BIM that also reflects project schedule, according to an embodiment. The planned mode may provide the basic 4D BIM visualization. Highlighted elements (e.g., with a bold or fluorescent color) are those portions of the construction site that according to the schedule are currently in progress and the elements are without color or highlighting have been completed. By advancing the time along the selectable timeline, the planned mode visualization may communicate the schedule visually with color coding of the 4D BIM. This visualization may help planners, engineers, and the like understand what tasks needs to be led and conducted on the jobsite in the coming weeks, analyze and communicate where these tasks are located and what resources are necessary, and in turn avoid potential delays.

Figure 23A:
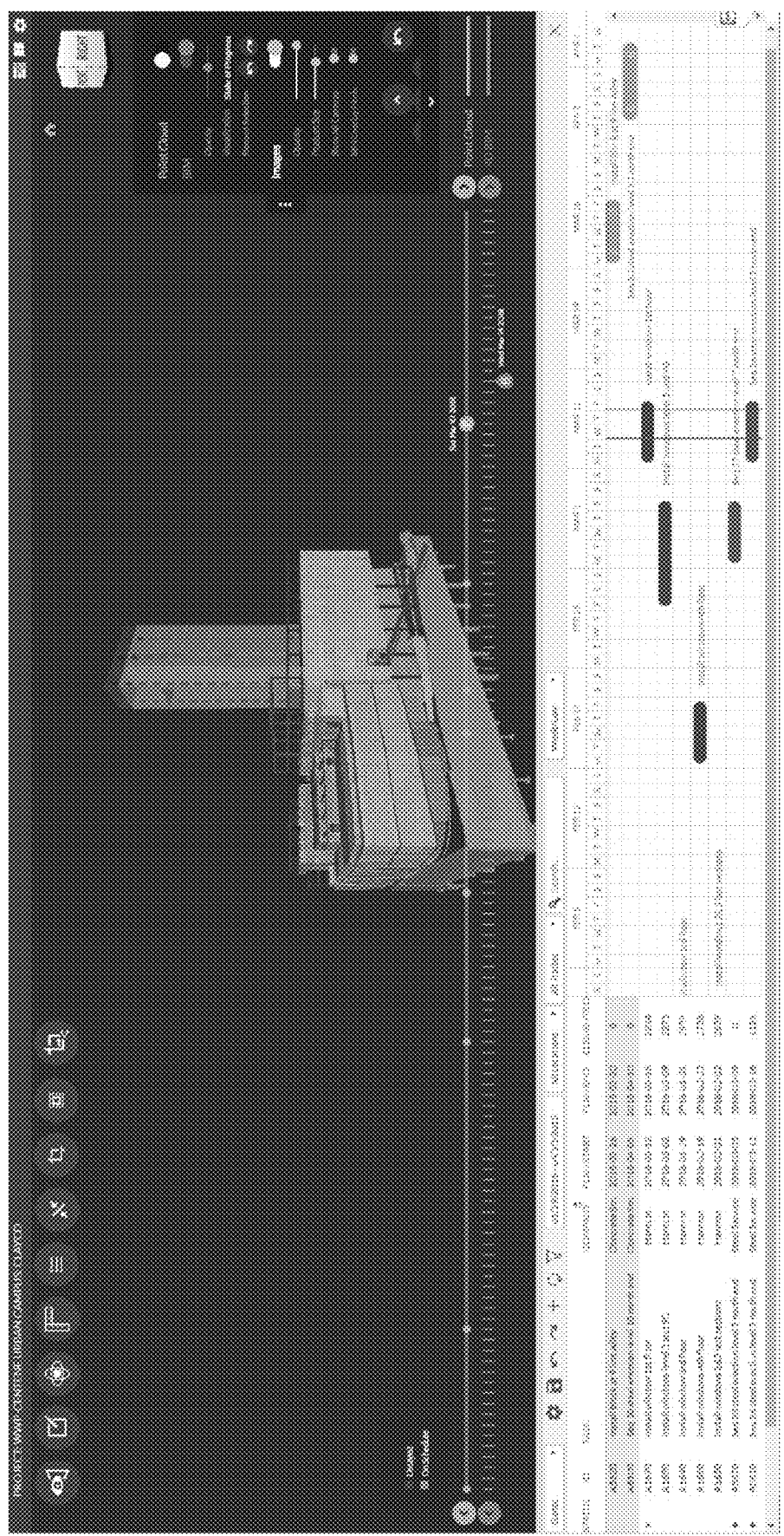
FIGS. 23A and 23B are images of a state of progress mode within the web-based interface that illustrates actual progress status on a BIM-based model, according to an embodiment.
Figure 23B:
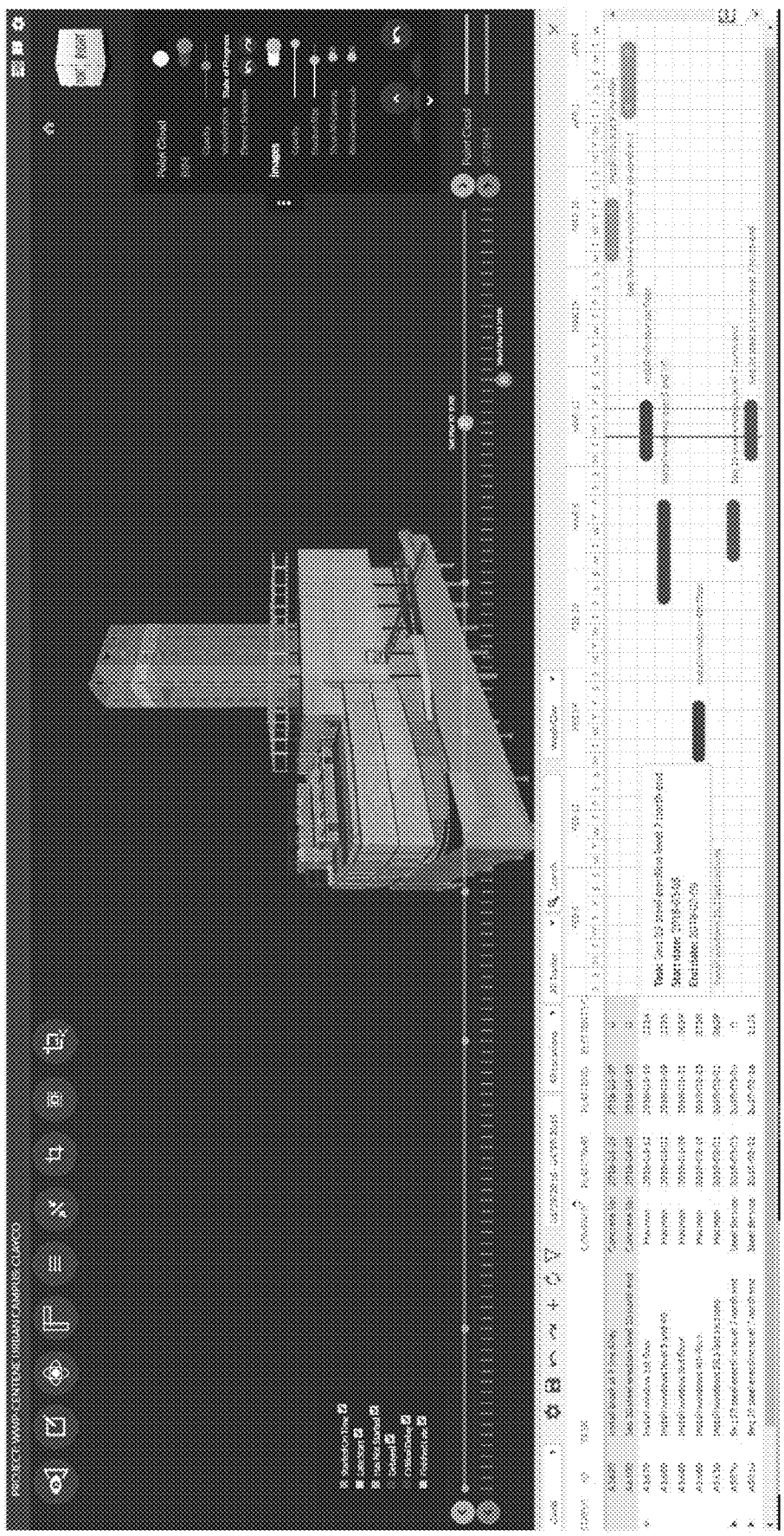

FIGS. 23A and 23B are images of a state of progress mode within the web-based interface that illustrates actual progress status on a BIM-based model, according to an embodiment. The state-of-progress mode illustrates the color-coded model based on the physical progress of the activities. A basic state-of-progress mode communicates if the task is delayed (red) or on schedule (green). An advanced state-of-progress mode has a more-detailed task status listed in FIG. 23C. Note that the colors of the icons are, as listed from top to bottom in FIG. 23C, green, yellow, yellow, red, red, green, and red.

In various embodiments, the processing logic may color code sections of elements of the 4D BIM according to work progress defined by a group of work statuses, to generate color-coded sections viewable on the 4D BIM. The processing logic may further display, in the GUI, a legend illustrating which colors designate which work status of the group of work statuses, and display, in the GUI, a list of activities with reference to the color-coded sections in a form of one or more of a bar chart, a spreadsheet, or a calendar. In one embodiment, the work statuses in the work progress include a combination of at least: started on time; late start; has not started; delayed; critical delay; and finished late.

Figure 24:
FIG. 24 is an image within the web-based interface in which locations most at risk for falling behind schedule are highlighted prior to a construction coordination meeting, according to an embodiment.

FIG. 24 is an image within the web-based interface in which locations most at risk for falling behind schedule are highlighted prior to a construction coordination meeting, according to an embodiment. A risk location mode illustrated in FIG. 24 may offer a color-coded model that indicates the at-risk location based on the LRI. The color coding follows the traffic light metaphor as high risk locations may be color coded in red, low risk location are color coded in green, and medium risk locations color coded in yellow, or according some of color scheme to identify at-risk locations of different levels. In various embodiments, the color sections of the elements of the 4D BIM according to level of risk for potential delay in the construction schedule and display, in the GUI, a legend illustrating which colors designate which level of risk for potential delay.

Figure 25:
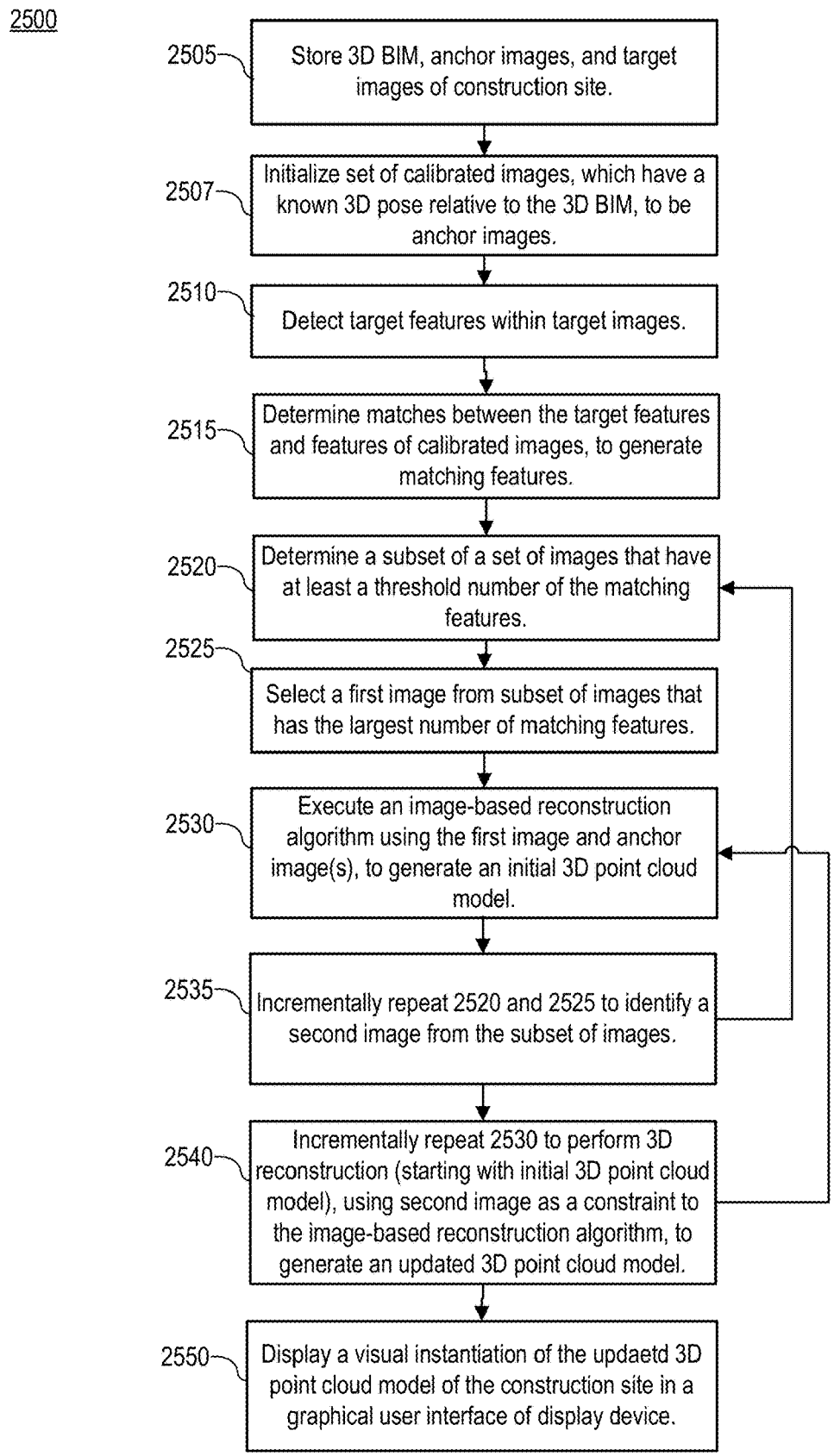
FIG. 25 is a flow chart of a method for computation of point cloud, as-built models for display and facilitation of user interaction with visualizations of construction progress monitoring, according to various embodiments.

FIG. 25 is a flow chart of a method 2500 for computation of point cloud, as-built models for display and facilitation of user interaction with visualizations of construction progress monitoring, according to various embodiments. The method 2500 may be performed by processing logic that may comprise hardware (e.g., circuitry, dedicated logic, programmable logic, microcode, etc.), software (such as instructions running on the processor), firmware or a combination thereof. In one embodiment, a processor of the system 100 or the processing device 110 performs the method 2500. Alternatively, other components of a computing device or cloud server may perform some or all of the operations of the method 2500.

With reference to FIG. 25, the method 2500 may begin with the processing logic storing, in the computer storage, a 3D BIM of a construction site, anchor images each depicting a viewpoint having a 3D pose and containing features with known 3D positions with respect to the 3D BIM, and target images of the construction site with unknown 3D position and orientation (2505). The 3D pose may include a 3D position and orientation relative to the 3D BIM, and the features may include at least one of structural points, edges, objects, or textured surfaces within the 3D BIM. The 3D pose of an anchor image may be determined by detecting selection, through the GUI, of corresponding points between the anchor image and the 3D BIM, or detecting selection, through the GUI, of corresponding points between an anchor 3D point cloud model, generated from the anchor images, and the 3D BIM. The method 2500 may continue with the processing logic initializing a set of calibrated images, which have a known 3D pose relative to the 3D BIM, to be the anchor images (2507).

The method 2500 may continue with the processing logic detecting target features within the target images (2510). The method 2500 may continue with the processing logic determining matches between the target features and the features of the set of calibrated images, to generate a plurality of matching features (2515). The method 2500 may continue with the processing logic determining a subset of the target images that have at least a threshold number of the matching features (2520). The method 2500 may continue with the processing logic selecting a first image from the subset of the target images that has the largest number of matching features (2525). The method 2500 may continue with the processing logic executing an image-based reconstruction algorithm using the first image and the anchor images to calibrate the first image to the BIM and generate an initial 3D point cloud model of the construction site (2530).

The method 2500 may continue with the processing logic incrementally repeating the steps at blocks 2520 and 2525 to identify a second image from the subset of images with a next largest number of matching features (2535). The method 2500 may continue with the processing logic incrementally repeating the step at block 2530 to perform, starting with the initial 3D point cloud model and using the second image and the anchor images as constraints to the image-based reconstruction algorithm, 3D reconstruction to generate an updated 3D point cloud model of the construction site (2540). In this step, the initial 3D point cloud model may also be a constraint to the image-based reconstruction algorithm, and each iteration of reconstruction may work on a previous updated 3D point cloud model to generate a newly updated 3D point cloud model. The method may continue with the processing logic displaying a visual instantiation of the complete 3D point cloud model of the construction site in a graphical user interface of a display device, wherein the visual instantiation of the updated 3D point cloud model includes at least the first image and the second image aligned to the 3D BIM (2550).

Figure 26:
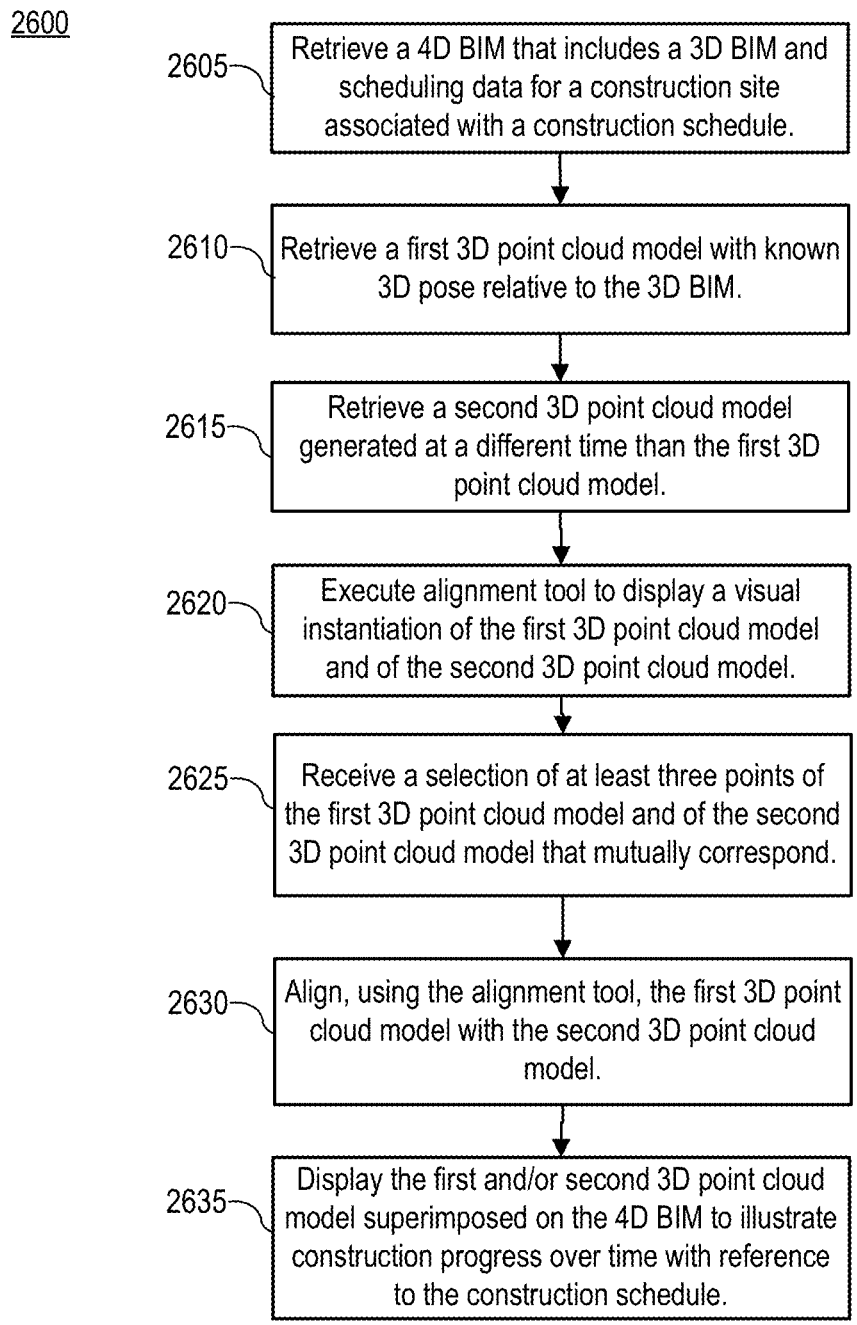
FIG. 26 is a flow chart of a method for alignment of 3D point clouds generated at different times to illustrate construction progress according to an embodiment.

FIG. 26 is a flow chart of a method for alignment of 3D point clouds generated at different times to illustrate construction progress according to an embodiment. The method 2600 may be performed by processing logic that may comprise hardware (e.g., circuitry, dedicated logic, programmable logic, microcode, etc.), software (such as instructions running on the processor), firmware or a combination thereof. In one embodiment, a processor of the system 100 or the processing device 200 performs the method 2600. Alternatively, other components of a computing device or cloud server may perform some or all of the operations of the method 2600.

With reference to FIG. 26, the method 2600 may begin with the processing logic retrieving a four-dimensional (4D) building information model (BIM) of a construction site, wherein the 4D BIM includes a three-dimensional (3D) BIM that reflects which elements are to be constructed by a given date according to a construction schedule (2605). The processing device may continue with the processing device retrieving a first three-dimensional (3D) point cloud model of a construction site with known 3D pose relative to the 3D BIM (2610). The method 2600 may continue with the processing logic retrieving second 3D point cloud model that is generated at a later time than the first 3D point cloud model (2615). The method 2600 may continue with the processing logic executing an alignment tool to display, in the GUI 138, a visual instantiation of the first 3D point cloud model and a visual instantiation of the second 3D point cloud model (2620). The method 2600 may continue with the processing logic receiving a selection, through the GUI, of at least three points of the first 3D point cloud model and of the second 3D point cloud model that mutually correspond (2625). The method 2600 may continue with the processing logic aligning, using the alignment tool, the first 3D point cloud model with the second 3D point cloud model based on the at least three points (2630). The method 2600 may continue with the processing logic displaying, in the GUI, at least one of the first 3D point cloud model or the second 3D point cloud model superimposed on the 4D BIM to illustrate as-built construction progress over time with reference to the construction schedule (2635).

Evaluation

Preliminary results shows the metrics and the system 100 improve the communication, coordination, and planning for construction projects. In one of the case studies, the project was delayed by two months before the team started to use the system 100 with the web-based and interactive interface. Plan Percent Complete (PPC) was employed as to delayed tasks to measure how the system 100 has improved the communication of tasks after the system is introduced. PPC has increased in a favorable trend and the PPC of almost all the weeks after the system introduced was above the national average. Specifically, the PPC increased 24% from a 46% baseline in six weeks and remains above the national average. The tasks delayed decreased from six to two tasks per week, and the average repeated tasks were reduced from 12 to four tasks per week, indicating that subcontractors become more committed to finish the tasks according to the plan.

The system 100 also measured the reliability of predicting at-risk locations. The reported at risk location tasks are delayed in seven of eight total tasks, and the task has also been repeated for multiple times over the duration. This shows that the disclosed methods reliability predicted these locations that were at risk for potential delay since they in fact exhibited actual delays mainly because appropriate control interventions were not proposed.

Web-Based 4D Simulation and Visualization

The disclosed system 100 facilitates the interactive creation of 4D BIM within a web-based environment. This includes interactive association of BIM elements with scheduled tasks, via BIM selection tree or the visual 3D interface, and animating construction sequences via the web-based system. FIG. 15 shows the newly created interfaces. As shown in FIG. 15, the project schedule—with Gantt chart, calendar, and timeline views—may be visualized at the bottom of the screen. A user can select any of the tasks listed in the project schedule and visually review the corresponding BIM elements and work location associated to that task in the 3D viewer. Alternatively, this interface can be used to associate BIM elements and various work locations to their corresponding tasks in the schedule.

The project schedule interface—with Gantt chart, calendar, and timeline views—allows the start and end data of tasks and their duration to be interactively changed, providing an opportunity for the project participants on the site and the last planners to have flexibility in making changes in the schedule, and in particular, weekly work plans, while the project participants are on site. The developed method also allows the integration of BIM elements and scheduled activities to be visualized and simulated in 4D through the GUI 138 on a display device. When necessary, the user can drag each of the components of the interface (model breakdown structure, or the scheduler), float them in the screen, or drag and push them into one of the sides (up, down, left, and right).

Figure 27:
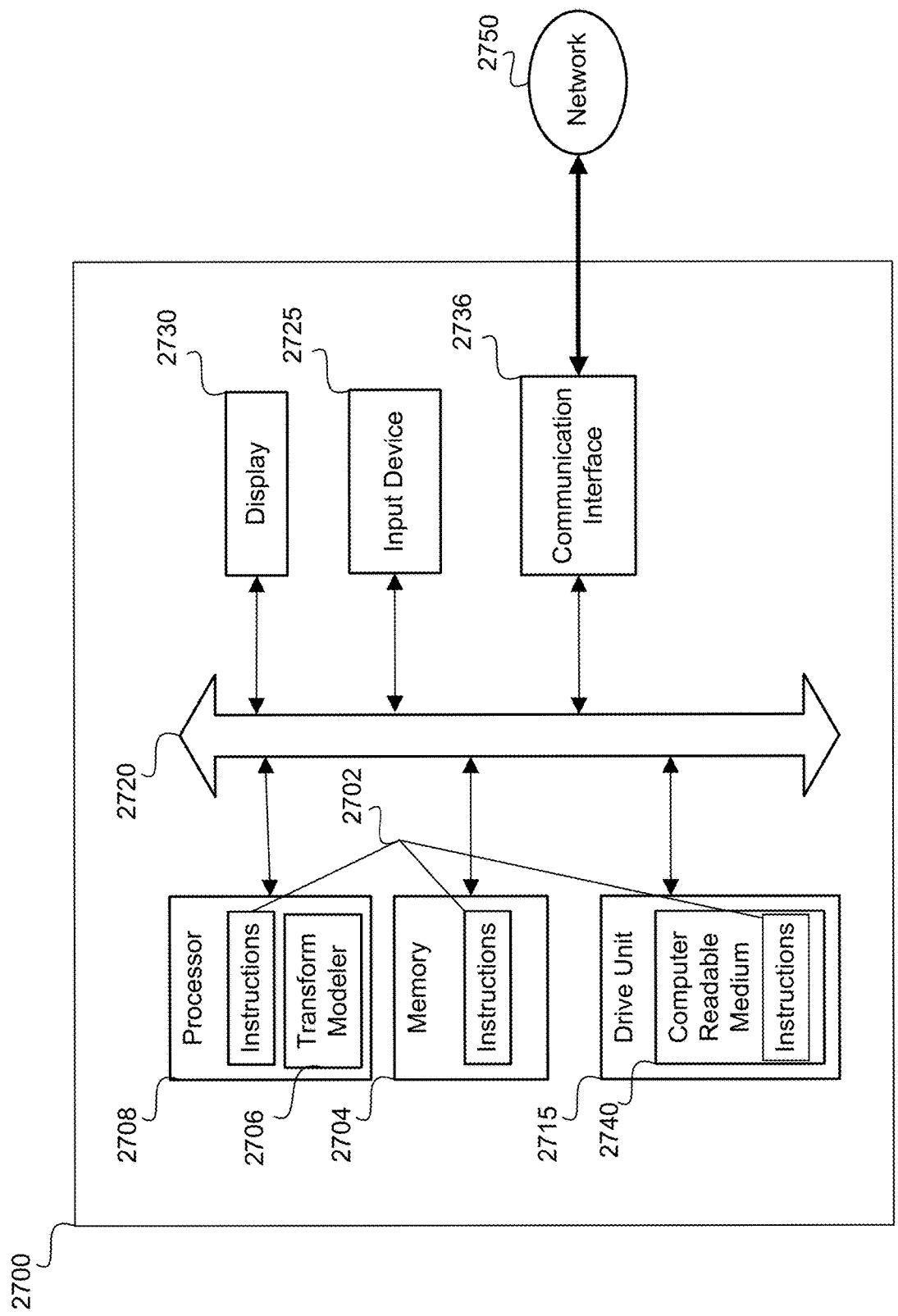
FIG. 27 is a computer system that may be used for executing the modeling and visualization techniques and embodiments disclosed herein.

FIG. 27 illustrates a general computer system 2700, which may represent the processing device 110 or any other device or system to which is referred or which is capable of executing the embodiment as disclosed herein. The computer system 2700 may include an ordered listing of a set of instructions 2702 that may be executed to cause the computer system 2700 to perform any one or more of the methods or computer-based functions disclosed herein. The computer system 2700 may operate as a stand-alone device or may be connected to other computer systems or peripheral devices, e.g., by using a network 2750.

In a networked deployment, the computer system 2700 may operate in the capacity of a server or as a client-user computer in a server-client user network environment, or as a peer computer system in a peer-to-peer (or distributed) network environment. The computer system 2700 may also be implemented as or incorporated into various devices, such as a personal computer or a mobile computing device capable of executing a set of instructions 2702 that specify actions to be taken by that machine, including and not limited to, accessing the internet or web through any form of browser. Further, each of the systems described may include any collection of sub-systems that individually or jointly execute a set, or multiple sets, of instructions to perform one or more computer functions.

The computer system 2700 may include a memory 2704 on a bus 2720 for communicating information. Code operable to cause the computer system to perform any of the acts or operations described herein may be stored in the memory 2704. The memory 2704 may be a random-access memory, read-only memory, programmable memory, hard disk drive or any other type of volatile or non-volatile memory or storage device.

The computer system 2700 may include a processor 2708, such as a central processing unit (CPU) and/or a graphics processing unit (GPU). The processor 2708 may include one or more general processors, digital signal processors, application specific integrated circuits, field programmable gate arrays, digital circuits, optical circuits, analog circuits, combinations thereof, or other now known or later-developed devices for analyzing and processing data. The processor 2708 may implement the set of instructions 2702 or other software program, such as manually-programmed or computer-generated code for implementing logical functions. The logical function or system element described may, among other functions, process and/or convert an analog data source such as an analog electrical, audio, or video signal, or a combination thereof, to a digital data source for audio-visual purposes or other digital processing purposes such as for compatibility for computer processing.

The processor 2708 may include a transform modeler 2706 or contain instructions for execution by a transform modeler 2706 provided a part from the processor 2708. The transform modeler 2706 may include logic for executing the instructions to perform the transform modeling and image reconstruction as discussed in the present disclosure.

The computer system 2700 may also include a disk (or optical) drive unit 2715. The disk drive unit 2715 may include a non-transitory computer-readable medium 2740 in which one or more sets of instructions 2702, e.g., software, can be embedded. Further, the instructions 2702 may perform one or more of the operations as described herein. The instructions 2702 may reside completely, or at least partially, within the memory 2704 and/or within the processor 2708 during execution by the computer system 2700. Accordingly, the databases displayed and described above with reference to FIGS. 2A and 2B may be stored in the memory 2704 and/or the disk unit 2715.

The memory 2704 and the processor 2708 also may include non-transitory computer-readable media as discussed above. A "computer-readable medium," "computer-readable storage medium," "machine readable medium," "propagated-signal medium," and/or "signal-bearing medium" may include any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium.

Additionally, the computer system 2700 may include an input device 2725, such as a keyboard or mouse, configured for a user to interact with any of the components of system 2700. It may further include a display 2730, such as a liquid crystal display (LCD), a cathode ray tube (CRT), or any other display suitable for conveying information. The display 2730 may act as an interface for the user to see the functioning of the processor 2708, or specifically as an interface with the software stored in the memory 2704 or the drive unit 2715.

The computer system 2700 may include a communication interface 2736 that enables communications via the communications network 2710. The network 2710 may include wired networks, wireless networks, or combinations thereof. The communication interface 2736 network may enable communications via a number of communication standards, such as 802.11, 802.17, 802.20, WiMax, cellular telephone standards, or other communication standards.

Accordingly, the method and system may be realized in hardware, software, or a combination of hardware and software. The method and system may be realized in a centralized fashion in at least one computer system or in a distributed fashion where different elements are spread across several interconnected computer systems. A computer system or other apparatus adapted for carrying out the methods described herein is suited to the present disclosure. A typical combination of hardware and software may be a general-purpose computer system with a computer program that, when being loaded and executed, controls the computer system such that it carries out the methods described herein. Such a programmed computer may be considered a special-purpose computer.

The method and system may also be embedded in a computer program product, which includes all the features enabling the implementation of the operations described herein and which, when loaded in a computer system, is able to carry out these operations. Computer program in the present context means any expression, in any language, code or notation, of a set of instructions intended to cause a system having an information processing capability to perform a particular function, either directly or after either or both of the following: a) conversion to another language, code or notation; b) reproduction in a different material form.

The above-disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present embodiments are to be determined by the broadest permissible interpretation of the following claims and their equivalents, and shall not be restricted or limited by the foregoing detailed description. While various embodiments have been described, it will be apparent to those of ordinary skill in the art that many more embodiments and implementations are possible within the scope of the above detailed description. Accordingly, the embodiments are not to be restricted except in light of the attached claims and their equivalents, now presented or presented in a subsequent application claiming priority to this application.

What is claimed is:

1. A system comprising:
a processing device; and
computer storage coupled to the processing device, the computer storage storing instructions and:
a three-dimensional (3D) building information model (BIM) of a construction site;
anchor images, each depicting a viewpoint having a 3D pose and containing features, wherein the 3D pose comprises a 3D position and orientation relative to the 3D BIM, and wherein the features comprise at least one of structural points, edges, objects, or textured surfaces of the construction site; and
target images of the construction site with viewpoints of unknown 3D position and orientation, and thus that are uncalibrated;
wherein the processing device is to execute the instructions to:
initialize a set of calibrated images, which have a known 3D pose relative to the 3D BIM, to be the anchor images;
detect target features within the target images;

determine matches between the target features and the features of the anchor images, to generate a plurality of matching features;

select a first image from a subset of the target images, each of which has at least a threshold number of the plurality of matching features, wherein the first image has the largest number of the plurality of matching features;

execute an image-based reconstruction algorithm using the first image and the anchor images to calibrate the first image to the 3D BIM and generate an initial 3D point cloud model of the construction site, wherein the initial 3D point cloud model includes 3D points derived from the first image;

select a second image from the subset of the target images that has a next largest number of the plurality of matching features;

execute, using the second image, the anchor images, and the initial 3D point cloud model as constraints, the image-based reconstruction algorithm to generate an updated 3D point cloud model and calibrate the second image to the 3D BIM, wherein the updated 3D point cloud model includes 3D points derived from at least the first image and the second image;

in response to calibration of the target images that have at least the threshold number of the plurality of matching features:
triangulate 3D points from only calibrated target images, to include the first image and the second image; and
generate a new 3D point cloud model from the triangulated 3D points; and display a visual instantiation of the new 3D point cloud model of the construction site in a graphical user interface (GUI) of a display device, wherein the visual instantiation of the new 3D point cloud model includes at least the first image and the second image aligned to the 3D BIM.

2. The system of claim 1, wherein the image-based reconstruction algorithm comprises a structure-from-motion (SfM) model that brings the first image and the second image into alignment with the 3D BIM, and wherein the processing device is further to execute the instructions to display the 3D BIM in association with the visual instantiation of the new 3D point cloud model and with scheduling indicia, to facilitate construction progress monitoring of the construction site via the GUI according to a construction schedule.

3. The system of claim 2, wherein the processing device is further to execute the instructions to:
store in the computer storage, in association with the 3D BIM, geometry information and semantic information comprising one or more of element quantity, element color, element material, and element structural analytics; and
provide, within a window of the graphical user interface, information related to the semantic information in response to selection of corresponding geometry of the 3D BIM.

4. The system of claim 1, wherein the processing device is further to execute the instructions to determine the 3D pose of an anchor image, comprising one of:
detect selection, through the GUI, of corresponding points between the anchor image and the 3D BIM; or
detect selection, through the GUI, of corresponding points between an anchor 3D point cloud model, generated from the anchor images, and the 3D BIM.

5. The system of claim 1, wherein to execute the image-based reconstruction algorithm using the second image, the processing device is to execute the instructions to:
detect a set of locations corresponding to site-registered fiduciary markers and surveying benchmarks in the second image; and
register the second image using locations within the set of locations as well as any of the matching features shared with the anchor images.

6. The system of claim 1, wherein the GUI is a web interface accessible by a user device over a network, and wherein to execute the image-based reconstruction algorithm using the second image, the processing device is to execute the instructions to:
display, in the web interface, the 3D BIM and the second image;
receive a selection, through the web interface, of at least three points of the 3D BIM and the second image that mutually corresponds; and
solve a similarity transformation between the second image and the at least three points of the 3D BIM to determine site coordinates of the at least three points.

7. The system of claim 1, wherein the processing device is further to execute the instructions to:
determine a target 3D pose of the first image that minimizes a sum of distances between 3D projection points corresponding to the plurality of matching features and 2D positions of the plurality of matching features;
calibrate, using the target 3D pose, the first image to the 3D BIM; and
generate, using the calibrated first image, the initial 3D point cloud model of the construction site.

8. A method comprising:
storing, within computer storage of a computing device:
a three-dimensional (3D) building information model (BIM) of a construction site;
anchor images, each depicting a viewpoint having a 3D pose and containing features, wherein the 3D pose comprises a 3D position and orientation relative to the 3D BIM, and wherein the features comprise at least one of structural points, edges, objects, or textured surfaces of the construction site; and
target images of the construction site with viewpoints of unknown 3D position and orientation, and thus that are uncalibrated;
initializing a set of calibrated images, which have a known 3D pose relative to the 3D BIM, to be the anchor images;
detecting, by a processing device of the computing device, target features within the target images;
determining, by the processing device, matches between the target features and the features of the anchor images, to generate a plurality of matching features;
selecting a first image from a subset of the target images, each of which has at least a threshold number of the plurality of matching features, wherein the first image has the largest number of the plurality of matching features;
executing, by the processing device, an image-based reconstruction algorithm using the first image and the anchor images to calibrate the first image to the 3D BIM and generate an initial 3D point cloud model of the construction site, wherein the initial 3D point cloud model includes 3D points derived from the first image;

selecting, by the processing device, a second image from the subset of the target images that has a next largest number of the plurality of matching features;

executing, by the processing device using the second image, the anchor images, and the initial 3D point cloud model as constraints, the image-based reconstruction algorithm to generate an updated 3D point cloud model and calibrate the second image to the 3D BIM, wherein the updated 3D point cloud model includes 3D points derived from at least the first image and the second image;

in response to calibration of the target images that have at least the threshold number of the plurality of matching features:

triangulate 3D points from only calibrated target images, to include the first image and the second image; and generate a new 3D point cloud model from the triangulated 3D points; and displaying, by the processing device, a visual instantiation of the new 3D point cloud model of the construction site in a graphical user interface (GUI) of a display device, wherein the visual instantiation of the new 3D point cloud model includes at least the first image and the second image aligned to the 3D BIM.

9. The method of claim 8, further comprising displaying a four-dimensional (4D) BIM with the instantiation of the new 3D point cloud model, wherein the 4D BIM includes the 3D BIM and scheduling indicia comprising which elements of the 3D BIM are to be constructed by a given date according to a construction schedule, to facilitate construction progress monitoring of the construction site via the GUI.

10. The method of claim 9, further comprising:

making the new 3D point cloud model selectively removable from the GUI;

retrieving a work breakdown structure (WBS) set of data that categorizes sections of the elements of the 4D BIM according to WBS locations each of which is assignable to a different work crew;

displaying, in the GUI, the 4D BIM with color-coded sections of the elements according to respective WBS locations; and displaying, in the GUI, a list of the WBS locations written in text and that includes a color legend corresponding to the color-coded sections.

11. The method of claim 9, further comprising:

making the new 3D point cloud model selectively removable from the GUI;

coloring sections of elements of the 4D BIM according to work crew assignment, to generate color-coded sections viewable on the 4D BIM;

displaying, in the GUI, a legend indicative of which work crew is handling which color-coded section according to color code; and displaying, in the GUI, a list of activities performed by respective work crews in a form of one or more of a bar chart, a spreadsheet, or a calendar, wherein the activities are color-coded the same as are the respective work crews in the 4D BIM and the legend.

12. The method of claim 9, further comprising:

displaying, in the GUI, scheduling data associated with the 4D BIM within at least one of a Gantt chart, a spreadsheet, or a calendar;

detecting, through the GUI, a user selection of a unit of measure for benchmarking and tracking progress associated with a work task; and in response to detection of the user selection, querying one or more databases for quantities associated with the query.

13. The method of claim 9, further comprising:

coloring sections of elements of the 4D BIM according to work progress defined by a group of work statuses, to generate color-coded sections viewable on the 4D BIM;

displaying, in the GUI, a legend illustrating which colors designate which work status of the group of work statuses; and displaying, in the GUI, a list of activities with reference to the color-coded sections in a form of one or more of a bar chart, a spreadsheet, or a calendar.

14. The method of claim 13, wherein the group of work statuses in the work progress comprise a combination of at least: started on time; late start; has not started; delayed; critical delay; and finished late.

15. The method of claim 13, wherein at least some of the activities within the list of activities are coded with specific icons indicative of the work status.

16. The method of claim 9, further comprising:

calculating a set of task readiness metrics that measure anticipated performance problems of a scheduled task of the construction schedule;

determining a level of risk of delay in completion of the scheduled task based on a combination of the task readiness metrics;

coloring sections of the elements of the 4D BIM according to level of risk for potential delay in the construction schedule, including a first color of a first section for the level of risk of delay of the scheduled task; and displaying, in the GUI, a legend illustrating which colors designate which level of risk for potential delay, including a first legend item that includes the first color that is associated with the level of risk of delay of the scheduled task.

17. The method of claim 8, further comprising:

determining a target 3D pose of the first image that minimizes a sum of distances between 3D projection points corresponding to the plurality of matching features and 2D positions of the plurality of matching features;

calibrating, using the target 3D pose, the first image to the 3D BIM; and generating, using the calibrated first image, the initial 3D point cloud model of the construction site.

* * * * *